US011552611B2

(12) United States Patent
Veselinovic et al.

(10) Patent No.: US 11,552,611 B2
(45) Date of Patent: Jan. 10, 2023

(54) SYSTEM AND METHOD FOR AUTOMATIC ADJUSTMENT OF REFERENCE GAIN

(71) Applicant: Shure Acquisition Holdings, Inc., Niles, IL (US)

(72) Inventors: Dusan Veselinovic, Chicago, IL (US); Michael Ryan Lester, Colorado Springs, CO (US)

(73) Assignee: Shure Acquisition Holdings, Inc., Niles, IL (US)

( * ) Notice: Subject to any disclaimer, the term of this patent is extended or adjusted under 35 U.S.C. 154(b) by 0 days.

(21) Appl. No.: 17/169,262

(22) Filed: Feb. 5, 2021

(65) Prior Publication Data

US 2021/0250009 A1 Aug. 12, 2021

Related U.S. Application Data

(60) Provisional application No. 62/971,850, filed on Feb. 7, 2020.

(51) Int. Cl.
*H04R 3/00* (2006.01)
*H04M 9/08* (2006.01)
(Continued)

(52) U.S. Cl.
CPC ............... *H03G 3/24* (2013.01); *H04M 9/08* (2013.01); *H04R 3/005* (2013.01); *H04R 5/04* (2013.01); *H04S 7/301* (2013.01); *H04S 2400/13* (2013.01)

(58) Field of Classification Search
CPC ................................. H04M 9/08; H04R 3/005
See application file for complete search history.

(56) References Cited

U.S. PATENT DOCUMENTS

| 1,535,408 A | 4/1925 | Fricke |
| 1,540,788 A | 6/1925 | McClure |

(Continued)

FOREIGN PATENT DOCUMENTS

| CA | 2359771 | 4/2003 |
| CA | 2475283 | 1/2005 |

(Continued)

OTHER PUBLICATIONS

"Philips Hue Bulbs and Wireless Connected Lighting System," Web page https://www.philips-hue.com/en-in, 8 pp, Sep. 23, 2020, retrieved from Internet Archive Wayback Machine, <https://web.archive.org/web/20200923171037/https://www.philips-hue.com/en-in> on Sep. 27, 2021.

(Continued)

*Primary Examiner* — Ping Lee
(74) *Attorney, Agent, or Firm* — Neal, Gerber & Eisenberg LLP

(57) ABSTRACT

Systems and methods are provided for automatically adjusting a reference gain of an audio mixer having a reference channel for receiving a far end audio signal from a remote location as a reference signal and a plurality of audio input channels for receiving audio signals captured by a plurality of microphone element. An exemplary method includes determining an echo level in an input audio signal received at a given audio input channel, and automatically determining a gain amount for the reference channel based on the echo level. An exemplary system includes a reference gain adjuster configured to automatically determine a gain amount for the reference channel based on an echo level detected in an input audio signal received at a given audio input channel.

20 Claims, 3 Drawing Sheets

(51) Int. Cl.
      *H03G 3/24*     (2006.01)
      *H04S 7/00*     (2006.01)
      *H04R 5/04*     (2006.01)

(56)            References Cited

U.S. PATENT DOCUMENTS

| | | |
|---|---|---|
| 1,965,830 A | 7/1934 | Hammer |
| 2,075,588 A | 3/1937 | Meyers |
| 2,113,219 A | 4/1938 | Olson |
| 2,164,655 A | 7/1939 | Kleerup |
| D122,771 S | 10/1940 | Doner |
| 2,233,412 A | 3/1941 | Hill |
| 2,268,529 A | 12/1941 | Stiles |
| 2,343,037 A | 2/1944 | Adelman |
| 2,377,449 A | 6/1945 | Prevette |
| 2,481,250 A | 9/1949 | Schneider |
| 2,521,603 A | 9/1950 | Prew |
| 2,533,565 A | 12/1950 | Eichelman |
| 2,539,671 A | 1/1951 | Olson |
| 2,777,232 A | 1/1957 | Kulicke |
| 2,828,508 A | 4/1958 | Labarre |
| 2,840,181 A | 6/1958 | Wildman |
| 2,882,633 A | 4/1959 | Howell |
| 2,912,605 A | 11/1959 | Tibbetts |
| 2,938,113 A | 5/1960 | Schnell |
| 2,950,556 A | 8/1960 | Larios |
| 3,019,854 A | 2/1962 | Obryant |
| 3,132,713 A | 5/1964 | Seeler |
| 3,143,182 A | 8/1964 | Sears |
| 3,160,225 A | 12/1964 | Sechrist |
| 3,161,975 A | 12/1964 | McMillan |
| 3,205,601 A | 9/1965 | Gawne |
| 3,239,973 A | 3/1966 | Hannes |
| 3,240,883 A | 3/1966 | Seeler |
| 3,310,901 A | 3/1967 | Sarkisian |
| 3,321,170 A | 5/1967 | Vye |
| 3,509,290 A | 4/1970 | Mochida |
| 3,573,399 A | 4/1971 | Schroeder |
| 3,657,490 A | 4/1972 | Scheiber |
| 3,696,885 A | 10/1972 | Grieg |
| 3,755,625 A | 8/1973 | Maston |
| 3,828,508 A | 8/1974 | Moeller |
| 3,857,191 A | 12/1974 | Sadorus |
| 3,895,194 A | 7/1975 | Fraim |
| 3,906,431 A | 9/1975 | Clearwaters |
| D237,103 S | 10/1975 | Fisher |
| 3,936,606 A | 2/1976 | Wanke |
| 3,938,617 A | 2/1976 | Forbes |
| 3,941,638 A | 3/1976 | Horky |
| 3,992,584 A | 11/1976 | Dugan |
| 4,007,461 A | 2/1977 | Luedtke |
| 4,008,408 A | 2/1977 | Kodama |
| 4,029,170 A | 6/1977 | Phillips |
| 4,032,725 A | 6/1977 | McGee |
| 4,070,547 A | 1/1978 | Dellar |
| 4,072,821 A | 2/1978 | Bauer |
| 4,096,353 A | 6/1978 | Bauer |
| 4,127,156 A | 11/1978 | Brandt |
| 4,131,760 A | 12/1978 | Christensen |
| 4,169,219 A | 9/1979 | Beard |
| 4,184,048 A | 1/1980 | Alcaide |
| 4,198,705 A | 4/1980 | Massa |
| D255,234 S | 6/1980 | Wellward |
| D256,015 S | 7/1980 | Doherty |
| 4,212,133 A | 7/1980 | Lufkin |
| 4,237,339 A | 12/1980 | Bunting |
| 4,244,096 A | 1/1981 | Kashichi |
| 4,244,906 A | 1/1981 | Heinemann |
| 4,254,417 A | 3/1981 | Speiser |
| 4,275,694 A | 6/1981 | Nagaishi |
| 4,296,280 A | 10/1981 | Richie |
| 4,305,141 A | 12/1981 | Massa |
| 4,308,425 A | 12/1981 | Momose |
| 4,311,874 A | 1/1982 | Wallace, Jr. |
| 4,330,691 A | 5/1982 | Gordon |
| 4,334,740 A | 6/1982 | Wray |
| 4,365,449 A | 12/1982 | Liautaud |
| 4,373,191 A | 2/1983 | Fette |
| 4,393,631 A | 7/1983 | Krent |
| 4,414,433 A | 11/1983 | Horie |
| 4,429,850 A | 2/1984 | Weber |
| 4,436,966 A | 3/1984 | Botros |
| 4,449,238 A | 5/1984 | Lee |
| 4,466,117 A | 8/1984 | Goerike |
| 4,485,484 A | 11/1984 | Flanagan |
| 4,489,442 A | 12/1984 | Anderson |
| 4,518,826 A | 5/1985 | Caudill |
| 4,521,908 A | 6/1985 | Miyaji |
| 4,566,557 A | 1/1986 | Lemaitre |
| 4,593,404 A | 6/1986 | Bolin |
| 4,594,478 A | 6/1986 | Gumb |
| D285,067 S | 8/1986 | Delbuck |
| 4,625,827 A | 12/1986 | Bartlett |
| 4,653,102 A | 3/1987 | Hansen |
| 4,658,425 A | 4/1987 | Julstrom |
| 4,669,108 A | 5/1987 | Deinzer |
| 4,675,906 A | 6/1987 | Sessler |
| 4,693,174 A | 9/1987 | Anderson |
| 4,696,043 A | 9/1987 | Iwahara |
| 4,712,231 A | 12/1987 | Julstrom |
| 4,741,038 A | 4/1988 | Elko |
| 4,752,961 A | 6/1988 | Kahn |
| 4,805,730 A | 2/1989 | O'Neill |
| 4,815,132 A | 3/1989 | Minami |
| 4,860,366 A | 8/1989 | Fukushi |
| 4,862,507 A | 8/1989 | Woodard |
| 4,866,868 A | 9/1989 | Kass |
| 4,881,135 A | 11/1989 | Heilweil |
| 4,888,807 A | 12/1989 | Reichel |
| 4,903,247 A | 2/1990 | Van Gerwen |
| 4,923,032 A | 5/1990 | Nuernberger |
| 4,928,312 A | 5/1990 | Hill |
| 4,969,197 A | 11/1990 | Takaya |
| 5,000,286 A | 3/1991 | Crawford |
| 5,038,935 A | 8/1991 | Wenkman |
| 5,058,170 A | 10/1991 | Kanamori |
| 5,088,574 A | 2/1992 | Kertesz, III |
| D324,780 S | 3/1992 | Sebesta |
| 5,121,426 A | 6/1992 | Baumhauer |
| D329,239 S | 9/1992 | Hahn |
| 5,189,701 A | 2/1993 | Jain |
| 5,204,907 A | 4/1993 | Staple |
| 5,214,709 A | 5/1993 | Ribic |
| D340,718 S | 10/1993 | Leger |
| 5,289,544 A | 2/1994 | Franklin |
| D345,346 S | 3/1994 | Alfonso |
| D345,379 S | 3/1994 | Chan |
| 5,297,210 A | 3/1994 | Julstrom |
| 5,322,979 A | 6/1994 | Cassity |
| 5,323,459 A | 6/1994 | Hirano |
| 5,329,593 A | 7/1994 | Lazzeroni |
| 5,335,011 A | 8/1994 | Addeo |
| 5,353,279 A | 10/1994 | Koyama |
| 5,359,374 A | 10/1994 | Schwartz |
| 5,371,789 A | 12/1994 | Hirano |
| 5,383,293 A | 1/1995 | Royal |
| 5,384,843 A | 1/1995 | Masuda |
| 5,396,554 A | 3/1995 | Hirano |
| 5,400,413 A | 3/1995 | Kindel |
| D363,045 S | 10/1995 | Phillips |
| 5,473,701 A | 12/1995 | Cezanne |
| 5,509,634 A | 4/1996 | Gebka |
| 5,513,265 A | 4/1996 | Hirano |
| 5,525,765 A | 6/1996 | Freiheit |
| 5,550,924 A | 8/1996 | Helf |
| 5,550,925 A | 8/1996 | Hori |
| 5,555,447 A | 9/1996 | Kotzin |
| 5,574,793 A | 11/1996 | Hirschhorn |
| 5,602,962 A | 2/1997 | Kellermann |
| 5,633,936 A | 5/1997 | Oh |
| 5,645,257 A | 7/1997 | Ward |
| D382,118 S | 8/1997 | Ferrero |
| 5,657,393 A | 8/1997 | Crow |
| 5,661,813 A | 8/1997 | Shimauchi |

(56) References Cited

U.S. PATENT DOCUMENTS

| | | |
|---|---|---|
| 5,673,327 A | 9/1997 | Julstrom |
| 5,687,229 A | 11/1997 | Sih |
| 5,706,344 A | 1/1998 | Finn |
| 5,715,319 A | 2/1998 | Chu |
| 5,717,171 A | 2/1998 | Miller |
| D392,977 S | 3/1998 | Kim |
| D394,061 S | 5/1998 | Fink |
| 5,761,318 A | 6/1998 | Shimauchi |
| 5,766,702 A | 6/1998 | Lin |
| 5,787,183 A | 7/1998 | Chu |
| 5,796,819 A | 8/1998 | Romesburg |
| 5,848,146 A | 12/1998 | Slattery |
| 5,870,482 A | 2/1999 | Loeppert |
| 5,878,147 A | 3/1999 | Killion |
| 5,888,412 A | 3/1999 | Sooriakumar |
| 5,888,439 A | 3/1999 | Miller |
| D416,315 S | 11/1999 | Nanjo |
| 5,978,211 A | 11/1999 | Hong |
| 5,991,277 A | 11/1999 | Maeng |
| 6,035,962 A | 3/2000 | Lin |
| 6,039,457 A | 3/2000 | O'Neal |
| 6,041,127 A | 3/2000 | Elko |
| 6,049,607 A | 4/2000 | Marash |
| D424,538 S | 5/2000 | Hayashi |
| 6,069,961 A | 5/2000 | Nakazawa |
| 6,125,179 A | 9/2000 | Wu |
| D432,518 S | 10/2000 | Muto |
| 6,128,395 A | 10/2000 | De Vries |
| 6,137,887 A | 10/2000 | Anderson |
| 6,144,746 A | 11/2000 | Azima |
| 6,151,399 A | 11/2000 | Killion |
| 6,173,059 B1 | 1/2001 | Huang |
| 6,198,831 B1 | 3/2001 | Azima |
| 6,205,224 B1 | 3/2001 | Underbrink |
| 6,215,881 B1 | 4/2001 | Azima |
| 6,266,427 B1 | 7/2001 | Mathur |
| 6,285,770 B1 | 9/2001 | Azima |
| 6,301,357 B1 | 10/2001 | Romesburg |
| 6,329,908 B1 | 12/2001 | Frecska |
| 6,332,029 B1 | 12/2001 | Azima |
| D453,016 S | 1/2002 | Nevill |
| 6,386,315 B1 | 5/2002 | Roy |
| 6,393,129 B1 | 5/2002 | Conrad |
| 6,424,635 B1 | 7/2002 | Song |
| 6,442,272 B1 | 8/2002 | Osovets |
| 6,449,593 B1 | 9/2002 | Valve |
| 6,481,173 B1 | 11/2002 | Roy |
| 6,488,367 B1 | 12/2002 | Debesis |
| D469,090 S | 1/2003 | Tsuji |
| 6,505,057 B1 | 1/2003 | Finn |
| 6,507,659 B1 | 1/2003 | Iredale |
| 6,510,919 B1 | 1/2003 | Roy |
| 6,526,147 B1 | 2/2003 | Rung |
| 6,556,682 B1 | 4/2003 | Gilloire |
| 6,592,237 B1 | 7/2003 | Pledger |
| 6,622,030 B1 | 9/2003 | Romesburg |
| D480,923 S | 10/2003 | Neubourg |
| 6,633,647 B1 | 10/2003 | Markow |
| 6,665,971 B2 | 12/2003 | Lowry |
| 6,694,028 B1 | 2/2004 | Matsuo |
| 6,704,422 B1 | 3/2004 | Jensen |
| D489,707 S | 5/2004 | Kobayashi |
| 6,731,334 B1 | 5/2004 | Maeng |
| 6,741,720 B1 | 5/2004 | Myatt |
| 6,757,393 B1 | 6/2004 | Spitzer |
| 6,768,795 B2 | 7/2004 | Feltstrom |
| 6,868,377 B1 | 3/2005 | Laroche |
| 6,885,750 B2 | 4/2005 | Egelmeers |
| 6,885,986 B1 | 4/2005 | Gigi |
| D504,889 S | 5/2005 | Andre |
| 6,889,183 B1 | 5/2005 | Gunduzhan |
| 6,895,093 B1 | 5/2005 | Ali |
| 6,931,123 B1 | 8/2005 | Hughes |
| 6,944,312 B2 | 9/2005 | Mason |
| D510,729 S | 10/2005 | Chen |
| 6,968,064 B1 | 11/2005 | Ning |
| 6,990,193 B2 | 1/2006 | Beaucoup |
| 6,993,126 B1 | 1/2006 | Kyrylenko |
| 6,993,145 B2 | 1/2006 | Combest |
| 7,003,099 B1 | 2/2006 | Zhang |
| 7,013,267 B1 | 3/2006 | Huart |
| 7,031,269 B2 | 4/2006 | Lee |
| 7,035,398 B2 | 4/2006 | Matsuo |
| 7,035,415 B2 | 4/2006 | Belt |
| 7,050,576 B2 | 5/2006 | Zhang |
| 7,054,451 B2 | 5/2006 | Janse |
| D526,643 S | 8/2006 | Ishizaki |
| D527,372 S | 8/2006 | Allen |
| 7,092,516 B2 | 8/2006 | Furuta |
| 7,092,882 B2 | 8/2006 | Arrowood |
| 7,098,865 B2 | 8/2006 | Christensen |
| 7,106,876 B2 | 9/2006 | Santiago |
| 7,120,269 B2 | 10/2006 | Lowell |
| 7,130,309 B2 | 10/2006 | Boaz |
| D533,177 S | 12/2006 | Andre |
| 7,149,320 B2 | 12/2006 | Haykin |
| 7,161,534 B2 | 1/2007 | Tsai |
| 7,187,765 B2 | 3/2007 | Popovic |
| 7,203,308 B2 | 4/2007 | Kubota |
| D542,543 S | 5/2007 | Bruce |
| 7,212,628 B2 | 5/2007 | Mirjana |
| D546,318 S | 7/2007 | Yoon |
| D546,814 S | 7/2007 | Takita |
| D547,748 S | 7/2007 | Tsuge |
| 7,239,714 B2 | 7/2007 | de Blok |
| D549,673 S | 8/2007 | Niitsu |
| 7,269,263 B2 | 9/2007 | Dedieu |
| D552,570 S | 10/2007 | Niitsu |
| D559,553 S | 1/2008 | Mischel |
| 7,333,476 B2 | 2/2008 | LeBlanc |
| D566,685 S | 4/2008 | Koller |
| 7,359,504 B1 | 4/2008 | Reuss |
| 7,366,310 B2 | 4/2008 | Stinson |
| 7,387,151 B1 | 6/2008 | Payne |
| 7,412,376 B2 | 8/2008 | Florencio |
| 7,415,117 B2 | 8/2008 | Tashev |
| D578,509 S | 10/2008 | Thomas |
| D581,510 S | 11/2008 | Albano |
| D582,391 S | 12/2008 | Morimoto |
| D587,709 S | 3/2009 | Niitsu |
| D589,605 S | 3/2009 | Reedy |
| 7,503,616 B2 | 3/2009 | Linhard |
| 7,515,719 B2 | 4/2009 | Hooley |
| 7,536,769 B2 | 5/2009 | Pedersen |
| D595,402 S | 6/2009 | Miyake |
| D595,736 S | 7/2009 | Son |
| 7,558,381 B1 | 7/2009 | Ali |
| 7,565,949 B2 | 7/2009 | Tojo |
| D601,585 S | 10/2009 | Andre |
| 7,651,390 B1 | 1/2010 | Profeta |
| 7,660,428 B2 | 2/2010 | Rodman |
| 7,667,728 B2 | 2/2010 | Kenoyer |
| 7,672,445 B1 | 3/2010 | Zhang |
| D613,338 S | 4/2010 | Marukos |
| 7,701,110 B2 | 4/2010 | Fukuda |
| 7,702,116 B2 | 4/2010 | Stone |
| D614,871 S | 5/2010 | Tang |
| 7,724,891 B2 | 5/2010 | Beaucoup |
| D617,441 S | 6/2010 | Koury |
| 7,747,001 B2 | 6/2010 | Kellermann |
| 7,756,278 B2 | 7/2010 | Moorer |
| 7,783,063 B2 | 8/2010 | Pocino |
| 7,787,328 B2 | 8/2010 | Chu |
| 7,830,862 B2 | 11/2010 | James |
| 7,831,035 B2 | 11/2010 | Stokes |
| 7,831,036 B2 | 11/2010 | Beaucoup |
| 7,856,097 B2 | 12/2010 | Tokuda |
| 7,881,486 B1 | 2/2011 | Killion |
| 7,894,421 B2 | 2/2011 | Kwan |
| D636,188 S | 4/2011 | Kim |
| 7,925,006 B2 | 4/2011 | Hirai |
| 7,925,007 B2 | 4/2011 | Stokes |
| 7,936,886 B2 | 5/2011 | Kim |
| 7,970,123 B2 | 6/2011 | Beaucoup |

(56) References Cited

U.S. PATENT DOCUMENTS

| | | |
|---|---|---|
| 7,970,151 B2 | 6/2011 | Oxford |
| D642,385 S | 8/2011 | Lee |
| D643,015 S | 8/2011 | Kim |
| 7,991,167 B2 | 8/2011 | Oxford |
| 7,995,768 B2 | 8/2011 | Miki |
| 8,000,481 B2 | 8/2011 | Nishikawa |
| 8,005,238 B2 | 8/2011 | Tashev |
| 8,019,091 B2 | 9/2011 | Burnett |
| 8,041,054 B2 | 10/2011 | Yeldener |
| 8,059,843 B2 | 11/2011 | Hung |
| 8,064,629 B2 | 11/2011 | Jiang |
| 8,085,947 B2 | 12/2011 | Haulick |
| 8,085,949 B2 | 12/2011 | Kim |
| 8,095,120 B1 | 1/2012 | Blair |
| 8,098,842 B2 | 1/2012 | Florencio |
| 8,098,844 B2 | 1/2012 | Elko |
| 8,103,030 B2 | 1/2012 | Barthel |
| 8,109,360 B2 | 2/2012 | Stewart, Jr. |
| 8,112,272 B2 | 2/2012 | Nagahama |
| 8,116,500 B2 | 2/2012 | Oxford |
| 8,121,834 B2 | 2/2012 | Rosec |
| D655,271 S | 3/2012 | Park |
| D656,473 S | 3/2012 | Laube |
| 8,130,969 B2 | 3/2012 | Buck |
| 8,130,977 B2 | 3/2012 | Chu |
| 8,135,143 B2 | 3/2012 | Ishibashi |
| 8,144,886 B2 | 3/2012 | Ishibashi |
| D658,153 S | 4/2012 | Woo |
| 8,155,331 B2 | 4/2012 | Nakadai |
| 8,170,882 B2 | 5/2012 | Davis |
| 8,175,291 B2 | 5/2012 | Chan |
| 8,175,871 B2 | 5/2012 | Wang |
| 8,184,801 B1 | 5/2012 | Hamalainen |
| 8,189,765 B2 | 5/2012 | Nishikawa |
| 8,189,810 B2 | 5/2012 | Wolff |
| 8,194,863 B2 | 6/2012 | Takumai |
| 8,199,927 B1 | 6/2012 | Raftery |
| 8,204,198 B2 | 6/2012 | Adeney |
| 8,204,248 B2 | 6/2012 | Haulick |
| 8,208,664 B2 | 6/2012 | Iwasaki |
| 8,213,596 B2 | 7/2012 | Beaucoup |
| 8,213,634 B1 | 7/2012 | Daniel |
| 8,219,387 B2 | 7/2012 | Cutler |
| 8,229,134 B2 | 7/2012 | Duraiswami |
| 8,233,352 B2 | 7/2012 | Beaucoup |
| 8,243,951 B2 | 8/2012 | Ishibashi |
| 8,244,536 B2 | 8/2012 | Arun |
| 8,249,273 B2 | 8/2012 | Inoda |
| 8,259,959 B2 | 9/2012 | Marton |
| 8,275,120 B2 | 9/2012 | Stokes, III |
| 8,280,728 B2 | 10/2012 | Chen |
| 8,284,949 B2 | 10/2012 | Farhang |
| 8,284,952 B2 | 10/2012 | Reining |
| 8,286,749 B2 | 10/2012 | Stewart |
| 8,290,142 B1 | 10/2012 | Lambert |
| 8,291,670 B2 | 10/2012 | Gard |
| 8,297,402 B2 | 10/2012 | Stewart |
| 8,315,380 B2 | 11/2012 | Liu |
| 8,331,582 B2 | 12/2012 | Steele |
| 8,345,898 B2 | 1/2013 | Reining |
| 8,355,521 B2 | 1/2013 | Larson |
| 8,370,140 B2 | 2/2013 | Vitte |
| 8,379,823 B2 | 2/2013 | Ratmanski |
| 8,385,557 B2 | 2/2013 | Tashev |
| D678,329 S | 3/2013 | Lee |
| 8,395,653 B2 | 3/2013 | Feng |
| 8,403,107 B2 | 3/2013 | Stewart |
| 8,406,436 B2 | 3/2013 | Craven |
| 8,428,661 B2 | 4/2013 | Chen |
| 8,433,061 B2 | 4/2013 | Cutler |
| D682,266 S | 5/2013 | Wu |
| 8,437,490 B2 | 5/2013 | Marton |
| 8,443,930 B2 | 5/2013 | Stewart, Jr. |
| 8,447,590 B2 | 5/2013 | Ishibashi |
| 8,472,639 B2 | 6/2013 | Reining |
| 8,472,640 B2 | 6/2013 | Marton |
| D685,346 S | 7/2013 | Szymanski |
| D686,182 S | 7/2013 | Ashiwa |
| 8,479,871 B2 | 7/2013 | Stewart |
| 8,483,398 B2 | 7/2013 | Fozunbal |
| 8,498,423 B2 | 7/2013 | Thaden |
| D687,432 S | 8/2013 | Duan |
| 8,503,653 B2 | 8/2013 | Ahuja |
| 8,515,089 B2 | 8/2013 | Nicholson |
| 8,515,109 B2 | 8/2013 | Dittberner |
| 8,526,633 B2 | 9/2013 | Ukai |
| 8,553,904 B2 | 10/2013 | Said |
| 8,559,611 B2 | 10/2013 | Ratmanski |
| D693,328 S | 11/2013 | Goetzen |
| 8,583,481 B2 | 11/2013 | Viveiros |
| 8,599,194 B2 | 12/2013 | Lewis |
| 8,600,443 B2 | 12/2013 | Kawaguchi |
| 8,605,890 B2 | 12/2013 | Zhang |
| 8,620,650 B2 | 12/2013 | Walters |
| 8,631,897 B2 | 1/2014 | Stewart |
| 8,634,569 B2 | 1/2014 | Lu |
| 8,638,951 B2 | 1/2014 | Zurek |
| D699,712 S | 2/2014 | Bourne |
| 8,644,477 B2 | 2/2014 | Gilbert |
| 8,654,955 B1 | 2/2014 | Lambert |
| 8,654,990 B2 | 2/2014 | Faller |
| 8,660,274 B2 | 2/2014 | Wolff |
| 8,660,275 B2 | 2/2014 | Buck |
| 8,670,581 B2 | 3/2014 | Harman |
| 8,672,087 B2 | 3/2014 | Stewart |
| 8,675,890 B2 | 3/2014 | Schmidt |
| 8,675,899 B2 | 3/2014 | Jung |
| 8,676,728 B1 | 3/2014 | Velusamy |
| 8,682,675 B2 | 3/2014 | Togami |
| 8,724,829 B2 | 5/2014 | Visser |
| 8,730,156 B2 | 5/2014 | Weising |
| 8,744,069 B2 | 6/2014 | Cutler |
| 8,744,101 B1 | 6/2014 | Burns |
| 8,755,536 B2 | 6/2014 | Chen |
| 8,811,601 B2 | 8/2014 | Mohammad |
| 8,818,002 B2 | 8/2014 | Tashev |
| 8,824,693 B2 | 9/2014 | Åhgren |
| 8,842,851 B2 | 9/2014 | Beaucoup |
| 8,855,326 B2 | 10/2014 | Derkx |
| 8,855,327 B2 | 10/2014 | Tanaka |
| 8,861,713 B2 | 10/2014 | Xu |
| 8,861,756 B2 | 10/2014 | Zhu |
| 8,873,789 B2 | 10/2014 | Bigeh |
| D717,272 S | 11/2014 | Kim |
| 8,886,343 B2 | 11/2014 | Ishibashi |
| 8,893,849 B2 | 11/2014 | Hudson |
| 8,898,633 B2 | 11/2014 | Bryant |
| D718,731 S | 12/2014 | Lee |
| 8,903,106 B2 | 12/2014 | Meyer |
| 8,923,529 B2 | 12/2014 | McCowan |
| 8,929,564 B2 | 1/2015 | Kikkeri |
| 8,942,382 B2 | 1/2015 | Elko |
| 8,965,546 B2 | 2/2015 | Visser |
| D725,059 S | 3/2015 | Kim |
| D725,631 S | 3/2015 | McNamara |
| 8,976,977 B2 | 3/2015 | De Sena et al. |
| 8,983,089 B1 | 3/2015 | Chu |
| 8,983,834 B2 | 3/2015 | Davis |
| D726,144 S | 4/2015 | Kang |
| D727,968 S | 4/2015 | Onoue |
| 9,002,028 B2 | 4/2015 | Haulick |
| D729,767 S | 5/2015 | Lee |
| 9,038,301 B2 | 5/2015 | Zelbacher |
| 9,088,336 B2 | 7/2015 | Mani |
| 9,094,496 B2 | 7/2015 | Teutsch |
| D735,717 S | 8/2015 | Lam |
| D737,245 S | 8/2015 | Fan |
| 9,099,094 B2 | 8/2015 | Burnett |
| 9,107,001 B2 | 8/2015 | Diethorn |
| 9,111,543 B2 | 8/2015 | Åhgren |
| 9,113,242 B2 | 8/2015 | Hyun |
| 9,113,247 B2 | 8/2015 | Chatlani |
| 9,126,827 B2 | 9/2015 | Hsieh |
| 9,129,223 B1 | 9/2015 | Velusamy |

(56) References Cited

U.S. PATENT DOCUMENTS

| | | |
|---|---|---|
| 9,140,054 B2 | 9/2015 | Oberbroeckling |
| D740,279 S | 10/2015 | Wu |
| 9,172,345 B2 | 10/2015 | Kok |
| D743,376 S | 11/2015 | Kim |
| D743,939 S | 11/2015 | Seong |
| 9,196,261 B2 | 11/2015 | Burnett |
| 9,197,974 B1 | 11/2015 | Clark |
| 9,203,494 B2 | 12/2015 | Tarighat Mehrabani |
| 9,215,327 B2 | 12/2015 | Bathurst |
| 9,215,543 B2 | 12/2015 | Sun |
| 9,226,062 B2 | 12/2015 | Sun |
| 9,226,070 B2 | 12/2015 | Hyun |
| 9,226,088 B2 | 12/2015 | Pandey |
| 9,232,185 B2 | 1/2016 | Graham |
| 9,237,391 B2 | 1/2016 | Benesty |
| 9,247,367 B2 | 1/2016 | Nobile |
| 9,253,567 B2 | 2/2016 | Morcelli |
| 9,257,132 B2 | 2/2016 | Gowreesunker |
| 9,264,553 B2 | 2/2016 | Pandey |
| 9,264,805 B2 | 2/2016 | Buck |
| 9,280,985 B2 | 3/2016 | Tawada |
| 9,286,908 B2 | 3/2016 | Zhang |
| 9,294,839 B2 | 3/2016 | Lambert |
| 9,301,049 B2 | 3/2016 | Elko |
| D754,103 S | 4/2016 | Fischer |
| 9,307,326 B2 | 4/2016 | Elko |
| 9,319,532 B2 | 4/2016 | Bao |
| 9,319,799 B2 | 4/2016 | Salmon |
| 9,326,060 B2 | 4/2016 | Nicholson |
| D756,502 S | 5/2016 | Lee |
| 9,330,673 B2 | 5/2016 | Cho |
| 9,338,301 B2 | 5/2016 | Pocino |
| 9,338,549 B2 | 5/2016 | Haulick |
| 9,354,310 B2 | 5/2016 | Visser |
| 9,357,080 B2 | 5/2016 | Beaucoup |
| 9,403,670 B2 | 8/2016 | Schelling |
| 9,426,598 B2 | 8/2016 | Walsh |
| D767,748 S | 9/2016 | Nakai |
| 9,451,078 B2 | 9/2016 | Yang |
| D769,239 S | 10/2016 | Li |
| 9,462,378 B2 | 10/2016 | Kuech |
| 9,473,868 B2 | 10/2016 | Huang |
| 9,479,627 B1 | 10/2016 | Rung |
| 9,479,885 B1 | 10/2016 | Ivanov |
| 9,489,948 B1 | 11/2016 | Chu |
| 9,510,090 B2 | 11/2016 | Lissek |
| 9,514,723 B2 | 12/2016 | Silfvast |
| 9,516,412 B2 | 12/2016 | Shigenaga |
| 9,521,057 B2 | 12/2016 | Klingbeil |
| 9,549,245 B2 | 1/2017 | Frater |
| 9,560,446 B1 | 1/2017 | Chang |
| 9,560,451 B2 | 1/2017 | Eichfeld |
| 9,565,493 B2 | 2/2017 | Abraham |
| 9,578,413 B2 | 2/2017 | Sawa |
| 9,578,440 B2 | 2/2017 | Otto |
| 9,589,556 B2 | 3/2017 | Gao |
| 9,591,123 B2 | 3/2017 | Sorensen |
| 9,591,404 B1 | 3/2017 | Chhetri |
| D784,299 S | 4/2017 | Cho |
| 9,615,173 B2 | 4/2017 | Sako |
| 9,628,596 B1 | 4/2017 | Bullough |
| 9,635,186 B2 | 4/2017 | Pandey |
| 9,635,474 B2 | 4/2017 | Kuster |
| D787,481 S | 5/2017 | Tyss |
| D788,073 S | 5/2017 | Silvera |
| 9,640,187 B2 | 5/2017 | Niemisto |
| 9,641,688 B2 | 5/2017 | Pandey |
| 9,641,929 B2 | 5/2017 | Li |
| 9,641,935 B1 | 5/2017 | Ivanov |
| 9,653,091 B2 | 5/2017 | Matsuo |
| 9,653,092 B2 | 5/2017 | Sun |
| 9,655,001 B2 | 5/2017 | Metzger |
| 9,659,576 B1 | 5/2017 | Kotvis |
| D789,323 S | 6/2017 | Mackiewicz |
| 9,674,604 B2 | 6/2017 | Deroo |
| 9,692,882 B2 | 6/2017 | Mani |
| 9,706,057 B2 | 7/2017 | Mani |
| 9,716,944 B2 | 7/2017 | Yliaho |
| 9,721,582 B1 | 8/2017 | Huang |
| 9,734,835 B2 | 8/2017 | Fujieda |
| 9,754,572 B2 | 9/2017 | Salazar |
| 9,761,243 B2 | 9/2017 | Taenzer |
| D801,285 S | 10/2017 | Timmins |
| 9,788,119 B2 | 10/2017 | Vilermo |
| 9,813,806 B2 | 11/2017 | Graham |
| 9,818,426 B2 | 11/2017 | Kotera |
| 9,826,211 B2 | 11/2017 | Sawa |
| 9,854,101 B2 | 12/2017 | Pandey |
| 9,854,363 B2 | 12/2017 | Sladeczek |
| 9,860,439 B2 | 1/2018 | Sawa |
| 9,866,952 B2 | 1/2018 | Pandey |
| D811,393 S | 2/2018 | Ahn |
| 9,894,434 B2 | 2/2018 | Rollow, IV |
| 9,930,448 B1 | 3/2018 | Chen |
| 9,936,290 B2 | 4/2018 | Mohammad |
| 9,966,059 B1 | 5/2018 | Ayrapetian |
| 9,973,848 B2 | 5/2018 | Chhetri |
| 9,980,042 B1 | 5/2018 | Benattar |
| D819,607 S | 6/2018 | Chui |
| D819,631 S | 6/2018 | Matsumiya |
| 10,015,589 B1 | 7/2018 | Ebenezer |
| 10,021,506 B2 | 7/2018 | Johnson |
| 10,021,515 B1 | 7/2018 | Mallya |
| 10,034,116 B2 | 7/2018 | Kadri |
| 10,054,320 B2 | 8/2018 | Choi |
| 10,153,744 B1 | 12/2018 | Every |
| 10,165,386 B2 | 12/2018 | Lehtiniemi |
| D841,589 S | 2/2019 | Böhmer |
| 10,206,030 B2 | 2/2019 | Matsumoto |
| 10,210,882 B1 | 2/2019 | McCowan |
| 10,231,062 B2 | 3/2019 | Pedersen |
| 10,244,121 B2 | 3/2019 | Mani |
| 10,244,219 B2 | 3/2019 | Sawa |
| 10,269,343 B2 | 4/2019 | Wingate |
| 10,367,948 B2 | 7/2019 | Wells-Rutherford |
| D857,873 S | 8/2019 | Shimada |
| 10,389,861 B2 | 8/2019 | Mani |
| 10,389,885 B2 | 8/2019 | Sun |
| D860,319 S | 9/2019 | Beruto |
| D860,997 S | 9/2019 | Sae |
| D864,136 S | 10/2019 | Kim |
| 10,440,469 B2 | 10/2019 | Barnett |
| D865,723 S | 11/2019 | Cho |
| 10,566,008 B2 | 2/2020 | Thorpe |
| 10,602,267 B2 | 3/2020 | Grosche |
| D883,952 S | 5/2020 | Lucas |
| 10,650,797 B2 | 5/2020 | Kumar |
| D888,020 S | 6/2020 | Lyu |
| 10,728,653 B2 | 7/2020 | Graham |
| D900,070 S | 10/2020 | Lantz |
| D900,071 S | 10/2020 | Lantz |
| D900,072 S | 10/2020 | Lantz |
| D900,073 S | 10/2020 | Lantz |
| D900,074 S | 10/2020 | Lantz |
| 10,827,263 B2 | 11/2020 | Christoph |
| 10,863,270 B1 | 12/2020 | O'Neill |
| 10,930,297 B2 | 2/2021 | Christoph |
| 10,959,018 B1 | 3/2021 | Shi |
| 10,979,805 B2 | 4/2021 | Chowdhary |
| D924,189 S | 7/2021 | Park |
| 11,109,133 B2 | 8/2021 | Lantz |
| D940,116 S | 1/2022 | Cho |
| 2001/0031058 A1 | 10/2001 | Anderson |
| 2002/0015500 A1 | 2/2002 | Belt |
| 2002/0041679 A1 | 4/2002 | Beaucoup |
| 2002/0048377 A1 | 4/2002 | Vaudrey |
| 2002/0064158 A1 | 5/2002 | Yokoyama |
| 2002/0064287 A1 | 5/2002 | Kawamura |
| 2002/0069054 A1 | 6/2002 | Arrowood |
| 2002/0110255 A1 | 8/2002 | Killion |
| 2002/0126861 A1 | 9/2002 | Colby |
| 2002/0131580 A1 | 9/2002 | Smith |
| 2002/0140633 A1 | 10/2002 | Rafii |
| 2002/0146282 A1 | 10/2002 | Wilkes |

(56) References Cited

U.S. PATENT DOCUMENTS

| | | |
|---|---|---|
| 2002/0149070 A1 | 10/2002 | Sheplak |
| 2002/0159603 A1 | 10/2002 | Hirai |
| 2003/0026437 A1 | 2/2003 | Janse |
| 2003/0053639 A1 | 3/2003 | Beaucoup |
| 2003/0059061 A1 | 3/2003 | Tsuji |
| 2003/0063762 A1 | 4/2003 | Tajima |
| 2003/0063768 A1 | 4/2003 | Cornelius |
| 2003/0072461 A1 | 4/2003 | Moorer |
| 2003/0107478 A1 | 6/2003 | Hendricks |
| 2003/0118200 A1 | 6/2003 | Beaucoup |
| 2003/0122777 A1 | 7/2003 | Grover |
| 2003/0138119 A1 | 7/2003 | Pocino |
| 2003/0156725 A1 | 8/2003 | Boone |
| 2003/0161485 A1 | 8/2003 | Smith |
| 2003/0163326 A1 | 8/2003 | Maase |
| 2003/0169888 A1 | 9/2003 | Subotic |
| 2003/0185404 A1 | 10/2003 | Milsap |
| 2003/0198339 A1 | 10/2003 | Roy |
| 2003/0198359 A1 | 10/2003 | Killion |
| 2003/0202107 A1 | 10/2003 | Slattery |
| 2004/0013038 A1 | 1/2004 | Kajala |
| 2004/0013252 A1 | 1/2004 | Craner |
| 2004/0076305 A1 | 4/2004 | Santiago |
| 2004/0105557 A1 | 6/2004 | Matsuo |
| 2004/0125942 A1 | 7/2004 | Beaucoup |
| 2004/0175006 A1 | 9/2004 | Kim |
| 2004/0202345 A1 | 10/2004 | Stenberg |
| 2004/0240664 A1 | 12/2004 | Freed |
| 2005/0005494 A1 | 1/2005 | Way |
| 2005/0041530 A1 | 2/2005 | Goudie |
| 2005/0069156 A1 | 3/2005 | Haapapuro |
| 2005/0094580 A1 | 5/2005 | Kumar |
| 2005/0094795 A1 | 5/2005 | Rambo |
| 2005/0149320 A1 | 7/2005 | Kajala |
| 2005/0157897 A1 | 7/2005 | Saltykov |
| 2005/0175189 A1 | 8/2005 | Lee |
| 2005/0175190 A1 | 8/2005 | Tashev |
| 2005/0213747 A1 | 9/2005 | Popovich |
| 2005/0221867 A1 | 10/2005 | Zurek |
| 2005/0238196 A1 | 10/2005 | Furuno |
| 2005/0270906 A1 | 12/2005 | Ramenzoni |
| 2005/0271221 A1 | 12/2005 | Cerwin |
| 2005/0286698 A1 | 12/2005 | Bathurst |
| 2005/0286729 A1 | 12/2005 | Harwood |
| 2006/0083390 A1 | 4/2006 | Kaderavek |
| 2006/0088173 A1 | 4/2006 | Rodman |
| 2006/0093128 A1 | 5/2006 | Oxford |
| 2006/0098403 A1 | 5/2006 | Smith |
| 2006/0104458 A1 | 5/2006 | Kenoyer |
| 2006/0109983 A1 | 5/2006 | Young |
| 2006/0151256 A1 | 7/2006 | Lee |
| 2006/0159293 A1 | 7/2006 | Azima |
| 2006/0161430 A1 | 7/2006 | Schweng |
| 2006/0165242 A1 | 7/2006 | Miki |
| 2006/0192976 A1 | 8/2006 | Hall |
| 2006/0198541 A1 | 9/2006 | Henry |
| 2006/0204022 A1 | 9/2006 | Hooley |
| 2006/0215866 A1 | 9/2006 | Francisco |
| 2006/0222187 A1 | 10/2006 | Jarrett |
| 2006/0233353 A1 | 10/2006 | Beaucoup |
| 2006/0239471 A1 | 10/2006 | Mao |
| 2006/0262942 A1 | 11/2006 | Oxford |
| 2006/0269080 A1 | 11/2006 | Oxford |
| 2006/0269086 A1 | 11/2006 | Page |
| 2007/0006474 A1 | 1/2007 | Taniguchi |
| 2007/0009116 A1 | 1/2007 | Reining |
| 2007/0019828 A1 | 1/2007 | Hughes |
| 2007/0053524 A1 | 3/2007 | Haulick |
| 2007/0093714 A1 | 4/2007 | Beaucoup |
| 2007/0116255 A1 | 5/2007 | Derkx |
| 2007/0120029 A1 | 5/2007 | Keung |
| 2007/0165871 A1 | 7/2007 | Roovers |
| 2007/0230712 A1 | 10/2007 | Belt |
| 2007/0253561 A1 | 11/2007 | Williams |
| 2007/0269066 A1 | 11/2007 | Derleth |
| 2008/0008339 A1 | 1/2008 | Ryan |
| 2008/0033723 A1 | 2/2008 | Jang |
| 2008/0046235 A1 | 2/2008 | Chen |
| 2008/0056517 A1 | 3/2008 | Algazi |
| 2008/0101622 A1 | 5/2008 | Sugiyama |
| 2008/0130907 A1 | 6/2008 | Sudo |
| 2008/0144848 A1 | 6/2008 | Buck |
| 2008/0168283 A1 | 7/2008 | Penning |
| 2008/0188965 A1 | 8/2008 | Bruey |
| 2008/0212805 A1 | 9/2008 | Fincham |
| 2008/0232607 A1 | 9/2008 | Tashev |
| 2008/0247567 A1 | 10/2008 | Kjolerbakken |
| 2008/0253553 A1 | 10/2008 | Li |
| 2008/0253589 A1 | 10/2008 | Trahms |
| 2008/0259731 A1 | 10/2008 | Happonen |
| 2008/0260175 A1 | 10/2008 | Elko |
| 2008/0279400 A1 | 11/2008 | Knoll |
| 2008/0285772 A1 | 11/2008 | Haulick |
| 2009/0003586 A1 | 1/2009 | Lai |
| 2009/0030536 A1 | 1/2009 | Gur |
| 2009/0052684 A1 | 2/2009 | Ishibashi |
| 2009/0086998 A1 | 4/2009 | Jeong |
| 2009/0087000 A1 | 4/2009 | Ko |
| 2009/0087001 A1 | 4/2009 | Jiang |
| 2009/0094817 A1 | 4/2009 | Killion |
| 2009/0129609 A1 | 5/2009 | Oh |
| 2009/0147967 A1 | 6/2009 | Ishibashi |
| 2009/0150149 A1 | 6/2009 | Cutter |
| 2009/0161880 A1 | 6/2009 | Hooley |
| 2009/0169027 A1 | 7/2009 | Ura |
| 2009/0173030 A1 | 7/2009 | Gulbrandsen |
| 2009/0173570 A1 | 7/2009 | Levit |
| 2009/0226004 A1 | 9/2009 | Moeller |
| 2009/0233545 A1 | 9/2009 | Sutskover |
| 2009/0237561 A1 | 9/2009 | Kobayashi |
| 2009/0254340 A1 | 10/2009 | Sun |
| 2009/0274318 A1 | 11/2009 | Ishibashi |
| 2009/0310794 A1 | 12/2009 | Ishibashi |
| 2010/0011644 A1 | 1/2010 | Kramer |
| 2010/0034397 A1 | 2/2010 | Nakadai |
| 2010/0074433 A1 | 3/2010 | Zhang |
| 2010/0111323 A1 | 5/2010 | Marton |
| 2010/0111324 A1 | 5/2010 | Yeldener |
| 2010/0119097 A1 | 5/2010 | Ohtsuka |
| 2010/0123785 A1 | 5/2010 | Chen |
| 2010/0128892 A1 | 5/2010 | Chen |
| 2010/0128901 A1 | 5/2010 | Herman |
| 2010/0131749 A1 | 5/2010 | Kim |
| 2010/0142721 A1 | 6/2010 | Wada |
| 2010/0150364 A1 | 6/2010 | Buck |
| 2010/0158268 A1 | 6/2010 | Marton |
| 2010/0165071 A1 | 7/2010 | Ishibashi |
| 2010/0166219 A1 | 7/2010 | Marton |
| 2010/0189275 A1 | 7/2010 | Christoph |
| 2010/0189299 A1 | 7/2010 | Grant |
| 2010/0202628 A1 | 8/2010 | Meyer |
| 2010/0208605 A1 | 8/2010 | Wang |
| 2010/0215184 A1 | 8/2010 | Buck |
| 2010/0215189 A1 | 8/2010 | Marton |
| 2010/0217590 A1 | 8/2010 | Nemer |
| 2010/0245624 A1 | 9/2010 | Beaucoup |
| 2010/0246873 A1 | 9/2010 | Chen |
| 2010/0284185 A1 | 11/2010 | Ngai |
| 2010/0305728 A1 | 12/2010 | Aiso |
| 2010/0314513 A1 | 12/2010 | Evans |
| 2011/0002469 A1 | 1/2011 | Ojala |
| 2011/0007921 A1 | 1/2011 | Stewart |
| 2011/0033063 A1 | 2/2011 | McGrath |
| 2011/0038229 A1 | 2/2011 | Beaucoup |
| 2011/0096136 A1 | 4/2011 | Liu |
| 2011/0096631 A1 | 4/2011 | Kondo |
| 2011/0096915 A1 | 4/2011 | Nemer |
| 2011/0164761 A1 | 7/2011 | McCowan |
| 2011/0194719 A1 | 8/2011 | Frater |
| 2011/0211706 A1 | 9/2011 | Tanaka |
| 2011/0235821 A1 | 9/2011 | Okita |
| 2011/0268287 A1 | 11/2011 | Ishibashi |
| 2011/0311064 A1 | 12/2011 | Teutsch |
| 2011/0311085 A1 | 12/2011 | Stewart |

(56) References Cited

U.S. PATENT DOCUMENTS

| | | |
|---|---|---|
| 2011/0317862 A1 | 12/2011 | Hosoe |
| 2012/0002835 A1 | 1/2012 | Stewart |
| 2012/0014049 A1 | 1/2012 | Ogle |
| 2012/0027227 A1 | 2/2012 | Kok |
| 2012/0076316 A1 | 3/2012 | Zhu |
| 2012/0080260 A1 | 4/2012 | Stewart |
| 2012/0093344 A1 | 4/2012 | Sun |
| 2012/0117474 A1 | 5/2012 | Miki |
| 2012/0128160 A1 | 5/2012 | Kim |
| 2012/0128175 A1 | 5/2012 | Visser |
| 2012/0155688 A1 | 6/2012 | Wilson |
| 2012/0155703 A1 | 6/2012 | Hernandez-Abrego |
| 2012/0163625 A1 | 6/2012 | Siotis |
| 2012/0169826 A1 | 7/2012 | Jeong |
| 2012/0177219 A1 | 7/2012 | Mullen |
| 2012/0182429 A1 | 7/2012 | Forutanpour |
| 2012/0207335 A1 | 8/2012 | Spaanderman |
| 2012/0224709 A1 | 9/2012 | Keddem |
| 2012/0243698 A1 | 9/2012 | Elko |
| 2012/0262536 A1 | 10/2012 | Chen |
| 2012/0288079 A1 | 11/2012 | Burnett |
| 2012/0288114 A1 | 11/2012 | Duraiswami |
| 2012/0294472 A1 | 11/2012 | Hudson |
| 2012/0327115 A1 | 12/2012 | Chhetri |
| 2012/0328142 A1 | 12/2012 | Horibe |
| 2013/0002797 A1 | 1/2013 | Thapa |
| 2013/0004013 A1 | 1/2013 | Stewart |
| 2013/0015014 A1 | 1/2013 | Stewart |
| 2013/0016847 A1 | 1/2013 | Steiner |
| 2013/0028451 A1 | 1/2013 | De Roo |
| 2013/0029684 A1 | 1/2013 | Kawaguchi |
| 2013/0034241 A1 | 2/2013 | Pandey |
| 2013/0039504 A1 | 2/2013 | Pandey |
| 2013/0083911 A1 | 4/2013 | Bathurst |
| 2013/0094689 A1 | 4/2013 | Tanaka |
| 2013/0101141 A1 | 4/2013 | McElveen |
| 2013/0136274 A1 | 5/2013 | Ahgren |
| 2013/0142343 A1 | 6/2013 | Matsui |
| 2013/0147835 A1 | 6/2013 | Lee |
| 2013/0156198 A1 | 6/2013 | Kim |
| 2013/0182190 A1 | 7/2013 | McCartney |
| 2013/0206501 A1 | 8/2013 | Yu |
| 2013/0216066 A1 | 8/2013 | Yerrace |
| 2013/0226593 A1 | 8/2013 | Magnusson |
| 2013/0251181 A1 | 9/2013 | Stewart |
| 2013/0264144 A1 | 10/2013 | Hudson |
| 2013/0271559 A1 | 10/2013 | Feng |
| 2013/0294616 A1 | 11/2013 | Mulder |
| 2013/0297302 A1 | 11/2013 | Pan |
| 2013/0304476 A1 | 11/2013 | Kim |
| 2013/0304479 A1 | 11/2013 | Teller |
| 2013/0329908 A1 | 12/2013 | Lindahl |
| 2013/0332156 A1 | 12/2013 | Tackin |
| 2013/0336516 A1 | 12/2013 | Stewart |
| 2013/0343549 A1 | 12/2013 | Vemireddy |
| 2014/0003635 A1 | 1/2014 | Mohammad |
| 2014/0010383 A1 | 1/2014 | Mackey |
| 2014/0016794 A1 | 1/2014 | Lu |
| 2014/0029761 A1 | 1/2014 | Maenpaa |
| 2014/0037097 A1 | 2/2014 | Labosco |
| 2014/0050332 A1 | 2/2014 | Nielsen |
| 2014/0072151 A1 | 3/2014 | Ochs |
| 2014/0098233 A1 | 4/2014 | Martin |
| 2014/0098964 A1 | 4/2014 | Rosca |
| 2014/0122060 A1 | 5/2014 | Kaszczuk |
| 2014/0177857 A1 | 6/2014 | Kuster |
| 2014/0233777 A1 | 8/2014 | Tseng |
| 2014/0233778 A1 | 8/2014 | Hardiman |
| 2014/0264654 A1 | 9/2014 | Salmon |
| 2014/0265774 A1 | 9/2014 | Stewart |
| 2014/0270271 A1 | 9/2014 | Dehe |
| 2014/0286518 A1 | 9/2014 | Stewart |
| 2014/0295768 A1 | 10/2014 | Wu |
| 2014/0301586 A1 | 10/2014 | Stewart |
| 2014/0307882 A1 | 10/2014 | Leblanc |
| 2014/0314251 A1 | 10/2014 | Rosca |
| 2014/0341392 A1 | 11/2014 | Lambert |
| 2014/0357177 A1 | 12/2014 | Stewart |
| 2014/0363008 A1 | 12/2014 | Chen |
| 2015/0003638 A1 | 1/2015 | Kasai |
| 2015/0025878 A1 | 1/2015 | Gowreesunker |
| 2015/0030172 A1 | 1/2015 | Gaensler |
| 2015/0033042 A1 | 1/2015 | Iwamoto |
| 2015/0050967 A1 | 2/2015 | Bao |
| 2015/0055796 A1 | 2/2015 | Nugent |
| 2015/0055797 A1 | 2/2015 | Nguyen |
| 2015/0063579 A1 | 3/2015 | Bao |
| 2015/0070188 A1 | 3/2015 | Aramburu |
| 2015/0078581 A1 | 3/2015 | Etter |
| 2015/0078582 A1 | 3/2015 | Graham |
| 2015/0097719 A1 | 4/2015 | Balachandreswaran |
| 2015/0104023 A1 | 4/2015 | Bilobrov |
| 2015/0117672 A1 | 4/2015 | Christoph |
| 2015/0118960 A1 | 4/2015 | Petit |
| 2015/0126255 A1 | 5/2015 | Yang |
| 2015/0156578 A1 | 6/2015 | Alexandridis |
| 2015/0163577 A1 | 6/2015 | Benesty |
| 2015/0185825 A1 | 7/2015 | Mullins |
| 2015/0189423 A1 | 7/2015 | Giannuzzi |
| 2015/0208171 A1 | 7/2015 | Funakoshi |
| 2015/0237424 A1 | 8/2015 | Wilker |
| 2015/0281832 A1 | 10/2015 | Kishimoto |
| 2015/0281833 A1 | 10/2015 | Shigenaga |
| 2015/0281834 A1 | 10/2015 | Takano |
| 2015/0312662 A1 | 10/2015 | Kishimoto |
| 2015/0312691 A1 | 10/2015 | Virolainen |
| 2015/0326968 A1 | 11/2015 | Shigenaga |
| 2015/0341734 A1 | 11/2015 | Sherman |
| 2015/0350621 A1 | 12/2015 | Sawa |
| 2015/0358734 A1 | 12/2015 | Butler |
| 2016/0011851 A1 | 1/2016 | Zhang |
| 2016/0021478 A1 | 1/2016 | Katagiri |
| 2016/0029120 A1 | 1/2016 | Nesta |
| 2016/0031700 A1 | 2/2016 | Sparks |
| 2016/0037277 A1 | 2/2016 | Matsumoto |
| 2016/0055859 A1 | 2/2016 | Finlow-Bates |
| 2016/0080867 A1 | 3/2016 | Nugent |
| 2016/0088392 A1 | 3/2016 | Huttunen |
| 2016/0100092 A1 | 4/2016 | Bohac |
| 2016/0105473 A1 | 4/2016 | Klingbeil |
| 2016/0111109 A1 | 4/2016 | Tsujikawa |
| 2016/0127527 A1 | 5/2016 | Mani |
| 2016/0134928 A1 | 5/2016 | Ogle |
| 2016/0142548 A1 | 5/2016 | Pandey |
| 2016/0142814 A1 | 5/2016 | Deroo |
| 2016/0142815 A1 | 5/2016 | Norris |
| 2016/0148057 A1 | 5/2016 | Oh |
| 2016/0150315 A1 | 5/2016 | Tzirkel-Hancock |
| 2016/0150316 A1 | 5/2016 | Kubota |
| 2016/0155455 A1 | 6/2016 | Ojanperä |
| 2016/0165340 A1 | 6/2016 | Benattar |
| 2016/0173976 A1 | 6/2016 | Podhradsky |
| 2016/0173978 A1 | 6/2016 | Li |
| 2016/0189727 A1 | 6/2016 | Wu |
| 2016/0192068 A1 | 6/2016 | Ng |
| 2016/0196836 A1 | 7/2016 | Yu |
| 2016/0234593 A1 | 8/2016 | Matsumoto |
| 2016/0275961 A1 | 9/2016 | Yu |
| 2016/0295279 A1 | 10/2016 | Srinivasan |
| 2016/0300584 A1 | 10/2016 | Pandey |
| 2016/0302002 A1 | 10/2016 | Lambert |
| 2016/0302006 A1 | 10/2016 | Pandey |
| 2016/0323667 A1 | 11/2016 | Shumard |
| 2016/0323668 A1 | 11/2016 | Abraham |
| 2016/0330545 A1 | 11/2016 | McElveen |
| 2016/0337523 A1 | 11/2016 | Pandey |
| 2016/0353200 A1 | 12/2016 | Bigeh |
| 2016/0357508 A1 | 12/2016 | Moore |
| 2017/0019744 A1 | 1/2017 | Matsumoto |
| 2017/0064451 A1 | 3/2017 | Park |
| 2017/0105066 A1 | 4/2017 | McLaughlin |
| 2017/0134849 A1 | 5/2017 | Pandey |
| 2017/0134850 A1 | 5/2017 | Graham |
| 2017/0164101 A1 | 6/2017 | Rollow, IV |

(56) References Cited

U.S. PATENT DOCUMENTS

| | | |
|---|---|---|
| 2017/0180861 A1 | 6/2017 | Chen |
| 2017/0206064 A1 | 7/2017 | Breazeal |
| 2017/0230748 A1 | 8/2017 | Shumard |
| 2017/0264999 A1 | 9/2017 | Fukuda |
| 2017/0303887 A1 | 10/2017 | Richmond |
| 2017/0308352 A1 | 10/2017 | Kessler |
| 2017/0374454 A1 | 12/2017 | Bernardini |
| 2018/0083848 A1 | 3/2018 | Siddiqi |
| 2018/0102136 A1 | 4/2018 | Ebenezer |
| 2018/0109873 A1 | 4/2018 | Xiang |
| 2018/0115799 A1 | 4/2018 | Thiele |
| 2018/0160224 A1 | 6/2018 | Graham |
| 2018/0196585 A1 | 7/2018 | Densham |
| 2018/0219922 A1 | 8/2018 | Bryans |
| 2018/0227666 A1 | 8/2018 | Barnett |
| 2018/0292079 A1 | 10/2018 | Branham |
| 2018/0310096 A1 | 10/2018 | Shumard |
| 2018/0313558 A1 | 11/2018 | Byers |
| 2018/0338205 A1 | 11/2018 | Abraham |
| 2018/0359565 A1 | 12/2018 | Kim |
| 2019/0042187 A1 | 2/2019 | Truong |
| 2019/0166424 A1 | 5/2019 | Harney |
| 2019/0215540 A1 | 7/2019 | Nicol |
| 2019/0230436 A1 | 7/2019 | Tsingos |
| 2019/0259408 A1 | 8/2019 | Freeman |
| 2019/0268683 A1 | 8/2019 | Miyahara |
| 2019/0295540 A1 | 9/2019 | Grima |
| 2019/0295569 A1 | 9/2019 | Wang |
| 2019/0319677 A1 | 10/2019 | Hansen |
| 2019/0371354 A1 | 12/2019 | Lester |
| 2019/0373362 A1 | 12/2019 | Ansai |
| 2019/0385629 A1 | 12/2019 | Moravy |
| 2019/0387311 A1 | 12/2019 | Schultz |
| 2020/0015021 A1 | 1/2020 | Leppanen |
| 2020/0021910 A1 | 1/2020 | Rollow, IV |
| 2020/0037068 A1 | 1/2020 | Barnett |
| 2020/0068297 A1 | 2/2020 | Rollow, IV |
| 2020/0100009 A1 | 3/2020 | Lantz |
| 2020/0100025 A1 | 3/2020 | Shumard |
| 2020/0137485 A1 | 4/2020 | Yamakawa |
| 2020/0145753 A1 | 5/2020 | Rollow, IV |
| 2020/0152218 A1 | 5/2020 | Kikuhara |
| 2020/0162618 A1 | 5/2020 | Enteshari |
| 2020/0228663 A1 | 7/2020 | Wells-Rutherford |
| 2020/0251119 A1 | 8/2020 | Yang |
| 2020/0275204 A1 | 8/2020 | Labosco |
| 2020/0278043 A1 | 9/2020 | Cao |
| 2020/0288237 A1 | 9/2020 | Abraham |
| 2021/0012789 A1 | 1/2021 | Husain |
| 2021/0021940 A1 | 1/2021 | Petersen |
| 2021/0044881 A1 | 2/2021 | Lantz |
| 2021/0051397 A1 | 2/2021 | Veselinovic |
| 2021/0098014 A1 | 4/2021 | Tanaka |
| 2021/0098015 A1* | 4/2021 | Pandey .................. H04R 3/005 |
| 2021/0120335 A1 | 4/2021 | Veselinovic |
| 2021/0200504 A1 | 7/2021 | Park |
| 2021/0375298 A1 | 12/2021 | Zhang |

FOREIGN PATENT DOCUMENTS

| | | |
|---|---|---|
| CA | 2505496 | 10/2006 |
| CA | 2838856 | 12/2012 |
| CA | 2846323 | 9/2014 |
| CN | 1780495 | 5/2006 |
| CN | 101217830 | 7/2008 |
| CN | 101833954 | 9/2010 |
| CN | 101860776 | 10/2010 |
| CN | 101894558 | 11/2010 |
| CN | 102646418 | 8/2012 |
| CN | 102821336 | 12/2012 |
| CN | 102833664 | 12/2012 |
| CN | 102860039 | 1/2013 |
| CN | 104036784 | 9/2014 |
| CN | 104053088 | 9/2014 |
| CN | 104080289 | 10/2014 |
| CN | 104347076 | 2/2015 |
| CN | 104581463 | 4/2015 |
| CN | 105355210 | 2/2016 |
| CN | 105548998 | 5/2016 |
| CN | 106162427 | 11/2016 |
| CN | 106251857 | 12/2016 |
| CN | 106851036 | 6/2017 |
| CN | 107221336 | 9/2017 |
| CN | 107534725 | 1/2018 |
| CN | 108172235 | 6/2018 |
| CN | 109087664 | 12/2018 |
| CN | 208190895 | 12/2018 |
| CN | 109727604 | 5/2019 |
| CN | 110010147 | 7/2019 |
| CN | 306391029 | 3/2021 |
| DE | 2941485 | 4/1981 |
| EM | 0077546430001 | 3/2020 |
| EP | 0381498 | 8/1990 |
| EP | 0594098 | 4/1994 |
| EP | 0869697 | 10/1998 |
| EP | 1180914 | 2/2002 |
| EP | 1184676 | 3/2002 |
| EP | 0944228 | 6/2003 |
| EP | 1439526 | 7/2004 |
| EP | 1651001 | 4/2006 |
| EP | 1727344 | 11/2006 |
| EP | 1906707 | 4/2008 |
| EP | 1952393 | 8/2008 |
| EP | 1962547 | 8/2008 |
| EP | 2133867 | 12/2009 |
| EP | 2159789 | 3/2010 |
| EP | 2197219 | 6/2010 |
| EP | 2360940 | 8/2011 |
| EP | 2721837 | 4/2014 |
| EP | 2772910 | 9/2014 |
| EP | 2778310 | 9/2014 |
| EP | 2942975 | 11/2015 |
| EP | 2988527 | 2/2016 |
| EP | 3131311 | 2/2017 |
| GB | 2393601 | 3/2004 |
| GB | 2446620 | 8/2008 |
| JP | S63144699 | 6/1988 |
| JP | H01260967 | 10/1989 |
| JP | H0241099 | 2/1990 |
| JP | H05260589 | 10/1993 |
| JP | H07336790 | 12/1995 |
| JP | 3175622 | 6/2001 |
| JP | 2003060530 | 2/2003 |
| JP | 2003087890 | 3/2003 |
| JP | 2004349806 | 12/2004 |
| JP | 2004537232 | 12/2004 |
| JP | 2005323084 | 11/2005 |
| JP | 2006094389 | 4/2006 |
| JP | 2006101499 | 4/2006 |
| JP | 4120646 | 8/2006 |
| JP | 4258472 | 8/2006 |
| JP | 4196956 | 9/2006 |
| JP | 2006340151 | 12/2006 |
| JP | 4760160 | 1/2007 |
| JP | 4752403 | 3/2007 |
| JP | 2007089058 | 4/2007 |
| JP | 4867579 | 6/2007 |
| JP | 2007208503 | 8/2007 |
| JP | 2007228069 | 9/2007 |
| JP | 2007228070 | 9/2007 |
| JP | 2007274131 | 10/2007 |
| JP | 2007274463 | 10/2007 |
| JP | 2007288679 | 11/2007 |
| JP | 2008005347 | 1/2008 |
| JP | 2008042754 | 2/2008 |
| JP | 2008154056 | 7/2008 |
| JP | 2008259022 | 10/2008 |
| JP | 2008263336 | 10/2008 |
| JP | 2008312002 | 12/2008 |
| JP | 2009206671 | 9/2009 |
| JP | 2010028653 | 2/2010 |
| JP | 2010114554 | 5/2010 |
| JP | 2010268129 | 11/2010 |
| JP | 2011015018 | 1/2011 |

(56) References Cited

FOREIGN PATENT DOCUMENTS

| | | |
|---|---|---|
| JP | 4779748 | 9/2011 |
| JP | 2012165189 | 8/2012 |
| JP | 5028944 | 9/2012 |
| JP | 5139111 | 2/2013 |
| JP | 5306565 | 10/2013 |
| JP | 5685173 | 3/2015 |
| JP | 2016051038 | 4/2016 |
| KR | 100298300 | 5/2001 |
| KR | 100901464 | 6/2009 |
| KR | 100960781 | 6/2010 |
| KR | 1020130033723 | 4/2013 |
| KR | 300856915 | 5/2016 |
| TW | 201331932 | 8/2013 |
| TW | I484478 | 5/2015 |
| WO | 1997008896 | 3/1997 |
| WO | 1998047291 | 10/1998 |
| WO | 2000030402 | 5/2000 |
| WO | 2003073786 | 9/2003 |
| WO | 2003088429 | 10/2003 |
| WO | 2004027754 | 4/2004 |
| WO | 2004090865 | 10/2004 |
| WO | 2006049260 | 5/2006 |
| WO | 2006071119 | 7/2006 |
| WO | 2006114015 | 11/2006 |
| WO | 2006121896 | 11/2006 |
| WO | 2007045971 | 4/2007 |
| WO | 2008074249 | 6/2008 |
| WO | 2008125523 | 10/2008 |
| WO | 2009039783 | 4/2009 |
| WO | 2009109069 | 9/2009 |
| WO | 2010001508 | 1/2010 |
| WO | 2010091999 | 8/2010 |
| WO | 2010140084 | 12/2010 |
| WO | 2010144148 | 12/2010 |
| WO | 2011104501 | 9/2011 |
| WO | 2012122132 | 9/2012 |
| WO | 2012140435 | 10/2012 |
| WO | 2012160459 | 11/2012 |
| WO | 2012174159 | 12/2012 |
| WO | 2013016986 | 2/2013 |
| WO | 2013182118 | 12/2013 |
| WO | 2014156292 | 10/2014 |
| WO | 2016176429 | 11/2016 |
| WO | 2016179211 | 11/2016 |
| WO | 2017208022 | 12/2017 |
| WO | 2018140444 | 8/2018 |
| WO | 2018140618 | 8/2018 |
| WO | 2018211806 | 11/2018 |
| WO | 2019231630 | 12/2019 |
| WO | 2020168873 | 8/2020 |
| WO | 2020191354 | 9/2020 |

OTHER PUBLICATIONS

"Vsa 2050 II Digitally Steerable Column Speaker," Web page https://www.rcf.it/en_US/products/product-detail/vsa-2050-ii/ 972389, 15 pages, Dec. 24, 2018.
Advanced Network Devices, IPSCM Ceiling Tile IP Speaker, Feb. 2011, 2 pgs.
Advanced Network Devices, IPSCM Standard 2' by 2' Ceiling Tile Speaker, 2 pgs.
Affes, et al., "A Signal Subspace Tracking Algorithm for Microphone Array Processing of Speech," IEEE Trans. On Speech and Audio Processing, vol. 5, No. 5, Sep. 1997, pp. 425-437.
Affes, et al., "A Source Subspace Tracking Array of Microphones for Double Talk Situations," 1996 IEEE International Conference on Acoustics, Speech, and Signal Processing Conference Proceedings, May 1996, pp. 909-912.
Affes, et al., "An Algorithm for Multisource Beamforming and Multitarget Tracking," IEEE Trans. On Signal Processing, vol. 44, No. 6, Jun. 1996, pp. 1512-1522.

Affes, et al., "Robust Adaptive Beamforming via LMS-Like Target Tracking," Proceedings of IEEE International Conference on Acoustics, Speech and Signal Processing, Apr. 1994, pp. IV-269-IV-272.
Ahonen, et al, "Directional Analysis of Sound Field with Linear Microphone Array and Applications in Sound Reproduction," Audio Engineering Sociey, Convention Paper 7329, May 2008, 11 pp.
Alarifi, et al., "Ultra Wideband Indoor Positioning Technologies: Analysis and Recent Advances," Sensors 2016, vol. 16, No. 707, 36 pp.
Amazon webpage for Metalfab MFLCRFG (last visited Apr. 22, 2020) available at <https://www.amazon.com/RETURN-FILTERGRILLE-Drop-Ceiling/dp/B0064Q9A7l/ref=sr 12?dchild= 1&keywords=drop+ceiling+return+air+grille&qid=1585862723&s= hi&sr=1-2>, 11 pp.
Armstrong "Walls" Catalog available at <https://www.armstrongceilings. com/content/dam/armstrongceilings/commercial/north-america/ catalogs/armstrong-ceilings-wallsspecifiers-reference.pdf>, 2019, 30 pp.
Armstrong Tectum Ceiling & Wall Panels Catalog available at <https://www.armstrongceilings.com/content/dam/armstrongceilings/ commercial/north-america/brochures/tectum-brochure.pdf>, 2019, 16 pp.
Armstrong Woodworks Concealed Catalog available at <https:// sweets.construction.com/swts_content_files/3824/442581.pdf>, 2014, 6 pp.
Armstrong Woodworks Walls Catalog available at <https://www. armstrongceilings.com/pdbupimagesclg/220600.pdf/download/data-sheet-woodworks-walls.pdf>, 2019, 2 pp.
Armstrong World Industries, Inc., I-Ceilings Sound Systems Speaker Panels, 2002, 4 pgs.
Armstrong, Acoustical Design: Exposed Structure, available at <https://www.armstrongceilings.com/pdbupimagesclg/217142.pdf/ download/acoustical-design-exposed-structurespaces-brochure. pdf>, 2018, 19 pp.
Armstrong, Ceiling Systems, Brochure page for Armstrong Softlook, 1995, 2 pp.
Armstrong, Excerpts from Armstrong 2011-2012 Ceiling Wall Systems Catalog, available at <https://web.archive.org/web/ 20121116034120/http://www.armstrong.com/commceilingsna/en_ us/pdf/ceilings_catalog_screen-2011 .pdf>, as early as 2012, 162 pp.
Armstrong, i-Ceilings, Brochure, 2009, 12 pp.
Arnold, et al., "A Directional Acoustic Array Using Silicon Micromachined Piezoresistive Microphones," Journal of the Acoustical Society of America, 113(1), Jan. 2003, 10 pp.
Atlas Sound, I128SYSM IP Compliant Loudspeaker System with Microphone Data Sheet, 2009, 2 pgs.
Atlas Sound, 1'X2' IP Speaker with Micophone for Suspended Ceiling Systems, https://www.atlasied.com/i128sysm, retrieved Oct. 25, 2017, 5 pgs.
Audio Technica, ES945 Omnidirectional Condenser Boundary Microphones, https://eu.audio-technica.com/resources/ES945% 20Specifications.pdf, 2007, 1 pg.
Audix Microphones, Audix Introduces Innovative Ceiling Mies, http://audixusa.com/docs_12/latest_news/EFpIFkAAkIOtSdolke. shtml, Jun. 2011, 6 pgs.
Audix Microphones, M70 Flush Mount Ceiling Mic, May 2016, 2 pgs.
Automixer Gated, Information Sheet, MIT, Nov. 2019, 9 pp.
Beh, et al., "Combining Acoustic Echo Cancellation and Adaptive Beamforming for Achieving Robust Speech Interface in Mobile Robot," 2008 IEEE/RSJ International Conference on Intelligent Robots and Systems, Sep. 2008, pp. 1693-1698.
Benesty, et al., "A New Class of Doubletalk Detectors Based on Cross-Correlation," IEEE Transactions on Speech and Audio Processing, vol. 8, No. 2, Mar. 2000, pp. 168-172.
Benesty, et al., "Adaptive Algorithms for Mimo Acoustic Echo Cancellation," AI2 Allen Institute for Artifical Intelligence, 2003.
Benesty, et al., "Differential Beamforming," Fundamentals of Signal Enhancement and Array Signal Processing, First Edition, 2017, 39 pp.

(56) References Cited

OTHER PUBLICATIONS

Benesty, et al., "Frequency-Domain Adaptive Filtering Revisited, Generalization to the Multi-Channel Case, and Application to Acoustic Echo Cancellation," 2000 IEEE International Conference on Acoustics, Speech, and Signal Processing Proceedings, Jun. 2000, pp. 789-792.
Benesty, et. al., "Microphone Array Signal Processing," Springer, 2010, 20 pp.
Berkun, et al., "Combined Beamformers for Robust Broadband Regularized Superdirective Beamforming," IEEE/ACM Transactions on Audio, Speech, and Language Processing, vol. 23, No. 5, May 2015, 10 pp.
Beyer Dynamic, Classis BM 32-33-34 DE-EN-FR 2016, 1 pg.
Beyer Dynamic, Classis-BM-33-PZ A1, 2013, 1 pg.
BNO055, Intelligent 9-axis absolute orientation sensor, Data sheet, Bosch, Nov. 2020, 118 pp.
Boyd, et al., Convex Optimization, Mar. 15, 1999, 216 pgs.
Brandstein, et al., "Microphone Arrays: Signal Processing Techniques and Applications," Digital Signal Processing, Springer-Verlag Berlin Heidelberg, 2001, 401 pgs.
Brooks, et al., "A Quantitative Assessment of Group Delay Methods for Identifying Glottal Closures in Voiced Speech," IEEE Transaction on Audio, Speech, and Language Processing, vol. 14, No. 2, Mar. 2006, 11 pp.
Bruel & Kjaer, by J.J. Christensen and J. Hald, Technical Review: Beamforming, No. 1, 2004, 54 pgs.
BSS Audio, Soundweb London Application Guides, 2010, 120 pgs.
Buchner, et al., "An Acoustic Human-Machine Interface with Multi-Channel Sound Reproduction," IEEE Fourth Workshop on Multimedia Signal Processing, Oct. 2001, pp. 359-364.
Buchner, et al., "An Efficient Combination of Multi-Channel Acoustic Echo Cancellation with a Beamforming Microphone Array," International Workshop on Hands-Free Speech Communication (HSC2001), Apr. 2001, pp. 55-58.
Buchner, et al., "Full-Duplex Communication Systems Using Loudspeaker Arrays and Microphone Arrays," IEEE International Conference on Multimedia and Expo, Aug. 2002, pp. 509-512.
Buchner, et al., "Generalized Multichannel Frequency-Domain Adaptive Filtering: Efficient Realization and Application to Hands-Free Speech Communication," Signal Processing 85, 2005, pp. 549-570.
Buchner, et al., "Multichannel Frequency-Domain Adaptive Filtering with Application to Multichannel Acoustic Echo Cancellation," Adaptive Signal Processing, 2003, pp. 95-128.
Buck, "Aspects of First-Order Differential Microphone Arrays in the Presence of Sensor Imperfections," Transactions on Emerging Telecommunications Technologies, 13.2, 2002, 8 pp.
Buck, et al., "First Order Differential Microphone Arrays for Automotive Applications," 7th International Workshop on Acoustic Echo and Noise Control, Darmstadt University of Technology, Sep. 10-13, 2001, 4 pp.
Buck, et al., "Self-Calibrating Microphone Arrays for Speech Signal Acquisition: A Systematic Approach," Signal Processing, vol. 86, 2006, pp. 1230-1238.
Burton, et al., "A New Structure for Combining Echo Cancellation and Beamforming in Changing Acoustical Environments," IEEE International Conference on Acoustics, Speech and Signal Processing, 2007, pp. 1-77-1-80.
BZ-3a Installation Instructions, XEDIT Corporation, Available at <chrome-extension://efaidnbmnnnibpcajpcglclefindmkaj/viewer. html?pdfurl=https%3A%2F%2Fwww.servo reelers.com%2Fmt-content%2Fuploads%2F2017%2F05%2Fbz-a-3universal-2017c.pdf &clen=189067&chunk=true>, 1 p.
Cabral, et al., Glottal Spectral Separation for Speech Synthesis, IEEE Journal of Selected Topics in Signal Processing, 2013, 15 pp.
Campbell, "Adaptive Beamforming Using a Microphone Array for Hands-Free Telephony," Virginia Polytechnic Institute and State University, Feb. 1999, 154 pgs.
Canetto, et al., "Speech Enhancement Systems Based on Microphone Arrays," VI Conference of the Italian Society for Applied and Industrial Mathematics, May 27, 2002, 9 pp.

Cech, et al., "Active-Speaker Detection and Localization with Microphones and Cameras Embedded into a Robotic Head," IEEE-RAS International Conference on Humanoid Robots, Oct. 2013, pp. 203-210.
Chan, et al., "Uniform Concentric Circular Arrays with Frequency-Invariant Characteristics-Theory, Design, Adaptive Beamforming and DOA Estimation," IEEE Transactions on Signal Processing, vol. 55, No. 1, Jan. 2007, pp. 165-177.
Chau, et al., "A Subband Beamformer on an Ultra Low-Power Miniature DSP Platform," 2002 IEEE International Conference on Acoustics, Speech, and Signal Processing, 4 pp.
Chen, et al., "A General Approach to the Design and Implementation of Linear Differential Microphone Arrays," Signal and Information Processing Association Annual Summit and Conference, 2013 Asia-Pacific, IEEE, 7 pp.
Chen, et al., "Design and Implementation of Small Microphone Arrays," PowerPoint Presentation, Northwestern Polytechnical University and Institut national de la recherche scientifique, Jan. 1, 2014, 56 pp.
Chen, et al., "Design of Robust Broadband Beamformers with Passband Shaping Characteristics using Tikhonov Regularization," IEEE Transactions on Audio, Speech, and Language Processing, vol. 17, No. 4, May 2009, pp. 565-681.
Chou, "Frequency-Independent Beamformer with Low Response Error," 1995 International Conference on Acoustics, Speech, and Signal Processing, pp. 2995-2998, May 9, 1995, 4 pp.
Chu, "Desktop Mic Array for Teleconferencing," 1995 International Conference on Acoustics, Speech, and Signal Processing, May 1995, pp. 2999-3002.
Circuit Specialists webpage for an aluminum enclosure, available at <https://www.circuitspecialists.com/metal-instrument-enclosure-la7.html?otaid=gpl&gclid=EAlalQobChMI2JTw-Ynm6AIVgbbICh3F4QKuEAkYBiABEgJZMPD_BwE>, 3 pp.
ClearOne Introduces Ceiling Microphone Array With Built-In Dante Interface, Press Release; GlobeNewswire, Jan. 8, 2019, 2 pp.
ClearOne Launches Second Generation of its Groundbreaking Beamforming Microphone Array, Press Release, Acquire Media, Jun. 1, 2016, 2 pp.
ClearOne to Unveil Beamforming Microphone Array with Adaptive Steering and Next Generation Acoustic Echo Cancellation Technology, Press Release, InfoComm, Jun. 4, 2012, 1 p.
ClearOne, Clearly Speaking Blog, "Advanced Beamforming Microphone Array Technology for Corporate Conferencing Systems," Nov. 11, 2013, 5 pp., http://www.clearone.com/blog/advanced-beamforming-microphone-array-technology-for-corporate-conferencing-systems/.
ClearOne, Beamforming Microphone Array, Mar. 2012, 6 pgs.
ClearOne, Ceiling Microphone Array Installation Manual, Jan. 9, 2012, 20 pgs.
ClearOne, Converge/Converge Pro, Manual, 2008, 51 pp.
ClearOne, Professional Conferencing Microphones, Brochure, Mar. 2015, 3 pp.
Coleman, "Loudspeaker Array Processing for Personal Sound Zone Reproduction," Centre for Vision, Speech and Signal Processing, 2014, 239 pp.
Cook, et al., An Alternative Approach to Interpolated Array Processing for Uniform Circular Arrays, Asia-Pacific Conference on Circuits and Systems, 2002, pp. 411-414.
Cox, et al., "Robust Adaptive Beamforming," IEEE Trans. Acoust., Speech, and Signal Processing, vol. ASSP-35, No. 10, Oct. 1987, pp. 1365-1376.
CTG Audio, Ceiling Microphone CTG CM-01, Jun. 5, 2008, 2 pgs.
CTG Audio, CM-01 & CM-02 Ceiling Microphones Specifications, 2 pgs.
CTG Audio, CM-01 & CM-02 Ceiling Microphones, 2017, 4 pgs.
CTG Audio, CTG FS-400 and RS-800 with "Beamforming" Technology, Datasheet, as early as 2009, 2 pp.
CTG Audio, Expand Your IP Teleconferencing to Full Room Audio, Obtained from website htt. )://www ct audio com/ex and-, our-i -teleconforencino-to-ful-room-audio-while-conquennc.1-echo-cancelation-issues Mull, 2014.
CTG Audio, Frequently Asked Questions, As early as 2009, 2 pp.
CTG Audio, Installation Manual, Nov. 21, 2008, 25 pgs.

(56) References Cited

OTHER PUBLICATIONS

CTG Audio, Introducing the CTG FS-400 and FS-800 with Beamforming Technology, as early as 2008, 2 pp.

CTG Audio, Meeting the Demand for Ceiling Mics in the Enterprise 5 Best Practices, Brochure, 2012, 9 pp.

Dahl et al., Acoustic Echo Cancelling with Microphone Arrays, Research Report Mar. 1995, Univ. of Karlskrona/Ronneby, Apr. 1995, 64 pgs.

Decawave, Application Note: APR001, Uwb Regulations, A Summary of Worldwide Telecommunications Regulations governing the use of Ultra-Wideband radio, Version 1.2, 2015, 63 pp.

Desiraju, et al., "Efficient Multi-Channel Acoustic Echo Cancellation Using Constrained Sparse Filter Updates in the Subband Domain," Acoustic Speech Enhancement Research, Sep. 2014, 4 pp.

DiBiase. et al., Robust Localization in Reverberent Rooms, in Brandstein, ed., Microphone Arrays: Techniques and Applications, 2001, Springer-Verlag Berlin Heidelberg, pp. 157-180.

Diethorn, "Audio Signal Processing for Next-Generation Multimedia Communication Systems," Chapter 4, 2004, 9 pp.

Digikey webpage for Converta box (last visited Apr. 22, 2020) <https://www.digikey.com/product-detail/en/bud-industries/CU-452-A/377-1969-ND/439257?utm_adgroup=Boxes&utm_source=google&utm_medium=cpc&utm_campaign=Shopping_Boxes%2C%20Enclosures%2C%20Racks_NEW&utm_term=&utm_content=Boxes&gclid=EAIaIQobChMI2JTw-Ynm6AIVgbblCh3F4QKuEAkYCSABEgKybPD_BwE>, 3 pp.

Digikey webpage for Pomona Box (last visited Apr. 22, 2020) available at <https://www.digikey.com/product-detail/en/pomonaelectronics/3306/501-2054-ND/736489>, 2 pp.

Digital Wireless Conference System, MCW-D 50, Beyerdynamic Inc., 2009, 18 pp.

Do et al., A Real-Time SRP-PHAT Source Location Implementation using Stochastic Region Contraction (SRC) on a Large-Aperture Microphone Array, 2007 IEEE International Conference on Acoustics, Speech and Signal Processing—ICASSP '07, , Apr. 2007, pp. I-121-I-124.

Dominguez, et al., "Towards an Environmental Measurement Cloud: Delivering Pollution Awareness to the Public," International Journal of Distributed Sensor Networks, vol. 10, Issue 3, Mar. 31, 2014, 17 pp.

Dormehl, "HoloLens concept lets you control your smart home via augmented reality," digitaltrends, Jul. 26, 2016, 12 pp.

Double Condenser Microphone SM 69, Datasheet, Georg Neumann GmbH, available at <https://ende.neumann.com/product_files/7453/download>, 8 pp.

Eargle, "The Microphone Handbook," Elar Publ. Co., 1st ed., 1981, 4 pp.

Enright, Notes From Logan, June edition of Scanlines, Jun. 2009, 9 pp.

Fan, et al., "Localization Estimation of Sound Source by Microphones Array," Procedia Engineering 7, 2010, pp. 312-317.

Firoozabadi, et al., "Combination of Nested Microphone Array and Subband Processing for Multiple Simultaneous Speaker Localization," 6th International Symposium on Telecommunications, Nov. 2012, pp. 907-912.

Flanagan et al., Autodirective Microphone Systems, Acustica, vol. 73, 1991, pp. 58-71.

Flanagan, et al., "Computer-Steered Microphone Arrays for Sound Transduction in Large Rooms," J. Acoust. Soc. Am. 78 (5), Nov. 1985, pp. 1508-1518.

Fohhn Audio New Generation of Beam Steering Systems Available Now, audioXpress Staff, May 10, 2017, 8 pp.

Fox, et al., "A Subband Hybrid Beamforming for In-Car Speech Enhancement," 20th European Signal rocessing Conference, Aug. 2012, 5 pp.

Frost, III, An Algorithm for Linearly Constrained Adaptive Array Processing, Proc. IEEE, vol. 60, No. 8, Aug. 1972, pp. 926-935.

Gannot et al., Signal Enhancement using Beamforming and Nonstationarity with Applications to Speech, IEEE Trans. On Signal Processing, vol. 49, No. 8, Aug. 2001, pp. 1614-1626.

Gansler et al., A Double-Talk Detector Based on Coherence, IEEE Transactions on Communications, vol. 44, No. 11, Nov. 1996, pp. 1421-1427.

Gazor et al., Robust Adaptive Beamforming via Target Tracking, IEEE Transactions on Signal Processing, vol. 44, No. 6, Jun. 1996, pp. 1589-1593.

Gazor et al., Wideband Multi-Source Beamforming with Adaptive Array Location Calibration and Direction Finding, 1995 International Conference on Acoustics, Speech, and Signal Processing, May 1995, pp. 1904-1907.

Gentner Communications Corp., AP400 Audio Perfect 400 Audioconferencing System Installation & Operation Manual, Nov. 1998, 80 pgs.

Gentner Communications Corp., XAP 800 Audio Conferencing System Installation & Operation Manual, Oct. 2001, 152 pgs.

Gil-Cacho et al., Multi-Microphone Acoustic Echo Cancellation Using Multi-Channel Warped Linear Prediction of Common Acoustical Poles, 18th European Signal Processing Conference, Aug. 2010, pp. 2121-2125.

Giuliani, et al., "Use of Different Microphone Array Configurations for Hands-Free Speech Recognition in Noisy and Reverberant Environment," IRST-Istituto per la Ricerca Scientifica e Tecnologica, Sep. 22, 1997, 4 pp.

Gritton et al., Echo Cancellation Algorithms, IEEE ASSP Magazine, vol. 1, issue 2, Apr. 1984, pp. 30-38.

Hald, et al., "A class of optimal broadband phased array geometries designed for easy construction," 2002 Int'l Congress & Expo. on Noise Control Engineering, Aug. 2002, 6 pp.

Hamalainen, et al., "Acoustic Echo Cancellation for Dynamically Steered Microphone Array Systems," 2007 IEEE Workshop on Applications of Signal Processing to Audio and Acoustics, Oct. 2007, pp. 58-61.

Hayo, Virtual Controls for Real Life, Web page downloaded from https://hayo.io/ on Sep. 18, 2019, 19 pp.

Herbordt et al., A Real-time Acoustic Human-Machine Front-End for Multimedia Applications Integrating Robust Adaptive Beamforrning and Stereophonic Acoustic Echo Cancellation, 7th International Conference on Spoken Language Processing, Sep. 2002, 4 pgs.

Herbordt et al., GSAEC—Acoustic Echo Cancellation embedded into the Generalized Sidelobe Canceller, 10th European Signal Processing Conference, Sep. 2000, 5 pgs.

Herbordt et al., Multichannel Bin-Wise Robust Frequency-Domain Adaptive Filtering and its Application to Adaptive Beamforming, IEEE Transactions on Audio, Speech, and Language Processing, vol. 15, No. 4, May 2007, pp. 1340-1351.

Herbordt, "Combination of Robust Adaptive Beamforming with Acoustic Echo Cancellation for Acoustic Human/Machine Interfaces," Friedrich-Alexander University, 2003, 293 pgs.

Herbordt, et al., Joint Optimization of LCMV Beamforming and Acoustic Echo Cancellation for Automatic Speech Recognition, IEEE International Conference on Acoustics, Speech, and Signal Processing, Mar. 2005, pp. III-77-III-80.

Holm, "Optimizing Microphone Arrays for use in Conference Halls," Norwegian University of Science and Technology, Jun. 2009, 101 pp.

Huang et al., Immersive Audio Schemes: The Evolution of Multiparty Teleconferencing, IEEE Signal Processing Magazine, Jan. 2011, pp. 20-32.

ICONYX Gen5, Product Overview; Renkus-Heinz, Dec. 24, 2018, 2 pp.

International Search Report and Written Opinion for PCT/US2016/022773 dated Jun. 10, 2016.

International Search Report and Written Opinion for PCT/US2016/029751 dated Nov. 28, 2016, 21 pp.

International Search Report and Written Opinion for PCT/US2018/013155 dated Jun. 8, 2018.

International Search Report and Written Opinion for PCT/US2019/031833 dated Jul. 24, 2019, 16 pp.

International Search Report and Written Opinion for PCT/US2019/033470 dated Jul. 31, 2019, 12 pp.

(56) References Cited

OTHER PUBLICATIONS

International Search Report and Written Opinion for PCT/US2019/051989 dated Jan. 10, 2020, 15 pp.
International Search Report and Written Opinion for PCT/US2020/024063 dated Aug. 31, 2020, 18 pp.
International Search Report and Written Opinion for PCT/US2020/035185 dated Sep. 15, 2020, 11 pp.
International Search Report and Written Opinion for PCT/US2020/058385 dated Mar. 31, 2021, 20 pp.
International Search Report and Written Opinion for PCT/US2021/070625 dated Sep. 17, 2021, 17 pp.
International Search Report for PCT/US2020/024005 dated Jun. 12, 2020, 12 pp.
Invensense, "Microphone Array Beamforming," Application Note AN-1140, Dec. 31, 2013, 12 pp.
Invensense, Recommendations for Mounting and Connecting InvenSense MEMS Microphones, Application Note AN-1003, 2013, 11 pp.
Ito et al., Aerodynamic/Aeroacoustic Testing in Anechoic Closed Test Sections of Low-speed Wind Tunnels, 16th AIAA/CEAS Aeroacoustics Conference, 2010, 11 pgs.
Johansson et al., Robust Acoustic Direction of Arrival Estimation using Root-SRP-PHAT, a Realtime Implementation, IEEE International Conference on Acoustics, Speech, and Signal Processing, Mar. 2005, 4 pgs.
Johansson, et al., Speaker Localisation using the Far-Field SRP-PHAT in Conference Telephony, 2002 International Symposium on Intelligent Signal Processing and Communication Systems, 5 pgs.
Johnson, et al., "Array Signal Processing: Concepts and Techniques," p. 59, Prentice Hall, 1993, 3 pp.
Julstrom et al., Direction-Sensitive Gating: A New Approach to Automatic Mixing, J. Audio Eng. Soc., vol. 32, No. 7/8, Jul./Aug. 1984, pp. 490-506.
Kahrs, Ed., The Past, Present, and Future of Audio Signal Processing, IEEE Signal Processing Magazine, Sep. 1997, pp. 30-57.
Kallinger et al., Multi-Microphone Residual Echo Estimation, 2003 IEEE International Conference on Acoustics, Speech, and Signal Processing, Apr. 2003, 4 pgs.
Kammeyer, et al., New Aspects of Combining Echo Cancellers with Beamformers, IEEE International Conference on Acoustics, Speech, and Signal Processing, Mar. 2005, pp. III-137-III-140.
Kellermann, A Self-Steering Digital Microphone Array, 1991 International Conference on Acoustics, Speech, and Signal Processing, Apr. 1991, pp. 3581-3584.
Kellermann, Acoustic Echo Cancellation for Beamforming Microphone Arrays, in Brandstein, ed., Microphone Arrays: Techniques and Applications, 2001, Springer-Verlag Berlin Heidelberg, pp. 281-306.
Kellermann, Integrating Acoustic Echo Cancellation with Adaptive Beamforming Microphone Arrays, Forum Acusticum, Berlin, Mar. 1999, pp. 1-4.
Kellermann, Strategies for Combining Acoustic Echo Cancellation and Adaptive Beamforming Microphone Arrays, 1997 IEEE International Conference on Acoustics, Speech, and Signal Processing, Apr. 1997, 4 pgs.
Klegon, "Achieve Invisible Audio with the MXA910 Ceiling Array Microphone," Jun. 27, 2016, 10 pp.
Knapp, et al., The Generalized Correlation Method for Estimation of Time Delay, IEEE Transactions on Acoustics, Speech, and Signal Processing, vol. ASSP-24, No. 4, Aug. 1976, pp. 320-327.
Kobayashi et al., A Hands-Free Unit with Noise Reduction by Using Adaptive Beamformer, IEEE Transactions on Consumer Electronics, vol. 54, No. 1, Feb. 2008, pp. 116-122.
Kobayashi et al., A Microphone Array System with Echo Canceller, Electronics and Communications in Japan, Part 3, vol. 89, No. 10, Feb. 2, 2006, pp. 23-32.
Kolundžija, et al., "Baffled circular loudspeaker array with broadband high directivity," 2010 IEEE International Conference on Acoustics, Speech and Signal Processing, Dallas, TX, 2010, pp. 73-76.
Lai, et al., "Design of Robust Steerable Broadband Beamformers with Spiral Arrays and the Farrow Filter Structure," Proc. Intl. Workshop Acoustic Echo Noise Control, 2010, 4 pp.
Lebret, et al., Antenna Array Pattern Synthesis via Convex Optimization, IEEE Trans. on Signal Processing, vol. 45, No. 3, Mar. 1997, pp. 526-532.
LecNet2 Sound System Design Guide, Lectrosonics, Jun. 2, 2006.
Lectrosonics, LecNet2 Sound System Design Guide, Jun. 2006, 28 pgs.
Lee et al., Multichannel Teleconferencing System with Multispatial Region Acoustic Echo Cancellation, International Workshop on Acoustic Echo and Noise Control (IWAENC2003), Sep. 2003, pp. 51-54.
Li, "Broadband Beamforming and Direction Finding Using Concentric Ring Array," Ph.D. Dissertation, University of Missouri-Columbia, Jul. 2005, 163 pp.
Lindstrom et al., An Improvement of the Two-Path Algorithm Transfer Logic for Acoustic Echo Cancellation, IEEE Transactions on Audio, Speech, and Language Processing, vol. 15, No. 4, May 2007, pp. 1320-1326.
Liu et al., Adaptive Beamforming with Sidelobe Control: A Second-Order Cone Programming Approach, IEEE Signal Proc. Letters, vol. 10, No. 11, Nov. 2003, pp. 331-334.
Liu, et al., "Frequency Invariant Beamforming in Subbands," IEEE Conference on Signals, Systems and Computers, 2004, 5 pp.
Liu, et al., "Wideband Beamforming," Wiley Series on Wireless Communications and Mobile Computing, pp. 143-198, 2010, 297 pp.
Lobo, et al., Applications of Second-Order Cone Programming, Linear Algebra and its Applications 284, 1998, pp. 193-228.
Luo et al., Wideband Beamforming with Broad Nulls of Nested Array, Third Int'l Conf. on Info. Science and Tech., Mar. 23-25, 2013, pp. 1645-1648.
Marquardt et al., A Natural Acoustic Front-End for Interactive TV in the EU-Project DICIT, IEEE Pacific Rim Conference on Communications, Computers and Signal Processing, Aug. 2009, pp. 894-899.
Martin, Small Microphone Arrays with Postfilters for Noise and Acoustic Echo Reduction, in Brandstein, ed., Microphone Arrays: Techniques and Applications, 2001, Springer-Verlag Berlin Heidelberg, pp. 255-279.
Maruo et al., On the Optimal Solutions of Beamformer Assisted Acoustic Echo Cancellers, IEEE Statistical Signal Processing Workshop, 2011, pp. 641-644.
McCowan, Microphone Arrays: A Tutorial, Apr. 2001, 36 pgs.
MFLCRFG Datasheet, Metal_Fab Inc., Sep. 7, 2007, 1 p.
Microphone Array Primer, Shure Question and Answer Page, <https://service.shure.com/s/article/microphone-array-primer?language=en_US>, Jan. 2019, 5 pp.
Milanovic, et al., "Design and Realization of FPGA Platform for Real Time Acoustic Signal Acquisition and Data Processing" 22nd Telecommunications Forum TELFOR, 2014, 6 pp.
Mohammed, A New Adaptive Beamformer for Optimal Acoustic Echo and Noise Cancellation with Less Computational Load, Canadian Conference on Electrical and Computer Engineering, May 2008, pp. 000123-000128.
Mohammed, A New Robust Adaptive Beamformer for Enhancing Speech Corrupted with Colored Noise, AICCSA, Apr. 2008, pp. 508-515.
Mohammed, Real-time Implementation of an efficient RLS Algorithm based on IIR Filter for Acoustic Echo Cancellation, AICCSA, Apr. 2008, pp. 489-494.
Mohan, et al., "Localization of multiple acoustic sources with small arrays using a coherence test," Journal Acoustic Soc Am., 123(4), Apr. 2008, 12 pp.
Moulines, et al., "Pitch-Synchronous Waveform Processing Techniques for Text-to-Speech Synthesis Using Diphones," Speech Communication 9, 1990, 15 pp.
Multichannel Acoustic Echo Cancellation, Obtained from website http://www.buchner-net.com/mcaec.html, Jun. 2011.

(56) References Cited

OTHER PUBLICATIONS

Myllyla et al., Adaptive Beamforming Methods for Dynamically Steered Microphone Array Systems, 2008 IEEE International Conference on Acoustics, Speech and Signal Processing, Mar.-Apr. 2008, pp. 305-308.
New Shure Microflex Advance MXA910 Microphone With Intellimix Audio Processing Provides Greater Simplicity, Flexibility, Clarity, Press Release, Jun. 12, 2019, 4 pp.
Nguyen-Ky, et al., "An Improved Error Estimation Algorithm for Stereophonic Acoustic Echo Cancellation Systems," 1st International Conference on Signal Processing and Communication Systems, Dec. 17-19, 2007, 5 pp.
Office Action for Taiwan Patent Application No. 105109900 dated May 5, 2017.
Office Action issued for Japanese Patent Application No. 2015-023781 dated Jun. 20, 2016, 4 pp.
Oh, et al., "Hands-Free Voice Communication in an Automobile With a Microphone Array," 1992 IEEE International Conference on Acoustics, Speech, and Signal Processing, Mar. 1992, pp. I-281-I-284.
Olszewski, et al., "Steerable Highly Directional Audio Beam Loudspeaker," Interspeech 2005, 4 pp.
Omologo, Multi-Microphone Signal Processing for Distant-Speech Interaction, Human Activity and Vision Summer School (HAVSS), INRIA Sophia Antipolis, Oct. 3, 2012, 79 pgs.
Order, Conduct of the Proceeding, *Clearone, Inc.* v. *Shure Acquisition Holdings, Inc.*, Nov. 2, 2020, 10 pp.
Pados et al., An Iterative Algorithm for the Computation of the MVDR Filter, IEEE Trans. On Signal Processing, vol. 49, No. 2, Feb. 2001, pp. 290-300.
Palladino, "This App Lets You Control Your Smarthome Lights via Augmented Reality," Next Reality Mobile AR News, Jul. 2, 2018, 5 pp.
Parikh, et al., "Methods for Mitigating IP Network Packet Loss in Real Time Audio Streaming Applications," GatesAir, 2014, 6 pp.
Pasha, et al., "Clustered Multi-channel Dereverberation for Ad-hoc Microphone Arrays," Proceedings of APSIPA Annual Summit and Conference, Dec. 2015, pp. 274-278.
Petitioner's Motion for Sanctions, *Clearone, Inc.* v. *Shure Acquisition Holdings, Inc.*, Aug. 24, 2020, 20 pp.
Pettersen, "Broadcast Applications for Voice-Activated Microphones," db, Jul./Aug. 1985, 6 pgs.
Pfeifenberger, et al., "Nonlinear Residual Echo Suppression using a Recurrent Neural Network," Interspeech 2020, 5 pp.
Phoenix Audio Technologies, "Beamforming and Microphone Arrays—Common Myths", Apr. 2016, http://info.phnxaudio.com/blog/microphone-arrays-beamforming-myths-1, 19 pp.
Plascore, PCGA-XR1 3003 Aluminum Honeycomb Data Sheet, 2008, 2 pgs.
Polycom Inc., Vortex EF2211/EF2210 Reference Manual, 2003, 66 pgs.
Polycom, Inc., Polycom Soundstructure C16, C12, C8, and SR12 Design Guide, Nov. 2013, 743 pgs.
Polycom, Inc., Setting Up the Polycom HDX Ceiling Microphone Array Series, https://support.polycom.com/content/dam/polycom-support/products/Telepresence-and-Video/HDX%20Series/setup-maintenance/en/hdx_ceiling_microphone_array_setting_up.pdf, 2010, 16 pgs.
Polycom, Inc., Vortex EF2241 Reference Manual, 2002, 68 pgs.
Polycom, Inc., Vortex EF2280 Reference Manual, 2001, 60 pp.
Pomona, Model 3306, Datasheet, Jun. 9, 1999, 1 p.
Powers, et al., "Proving Adaptive Directional Technology Works: A Review of Studies," The Hearing Review, Apr. 6, 2004, 5 pp.
Prime, et al., "Beamforming Array Optimisation Averaged Sound Source Mapping on a Model Wind Turbine," ResearchGate, Nov. 2014, 10 pp.
Rabinkin et al., Estimation of Wavefront Arrival Delay Using the Cross-Power Spectrum Phase Technique, 132nd Meeting of the Acoustical Society of America, Dec. 1996, pp. 1-10.

Rane Corp., Halogen Acoustic Echo Cancellation Guide, AEC Guide Version 2, Nov. 2013, 16 pgs.
Rao, et al., "Fast LMS/Newton Algorithms for Stereophonic Acoustic Echo Cancelation," IEEE Transactions on Signal Processing, vol. 57, No. 8, Aug. 2009.
Reuven et al., Joint Acoustic Echo Cancellation and Transfer Function GSC in the Frequency Domain, 23rd IEEE Convention of Electrical and Electronics Engineers in Israel, Sep. 2004, pp. 412-415.
Reuven et al., Joint Noise Reduction and Acoustic Echo Cancellation Using the Transfer-Function Generalized Sidelobe Canceller, Speech Communication, vol. 49, 2007, pp. 623-635.
Reuven, et al., "Multichannel Acoustic Echo Cancellation and Noise Reduction in Reverberant Environments Using the Transfer-Function GSC," 2007 IEEE International Conference on Acoustics, Speech and Signal Processing, Apr. 2007, 4 pp.
Ristimaki, Distributed Microphone Array System for Two-Way Audio Communication, Helsinki Univ. of Technology, Master's Thesis, Jun. 15, 2009, 73 pgs.
Rombouts et al., An Integrated Approach to Acoustic Noise and Echo Cancellation, Signal Processing 85, 2005, pp. 849-871.
Sällberg, "Faster Subband Signal Processing," IEEE Signal Processing Magazine, vol. 30, No. 5, Sep. 2013, 6 pp.
Sasaki et al., A Predefined Command Recognition System Using a Ceiling Microphone Array in Noisy Housing Environments, 2008 IEEE/RSJ International Conference on Intelligent Robots and Systems, Sep. 2008, pp. 2178-2184.
Sennheiser, New microphone solutions for ceiling and desk installation, https://en-us.sennheiser.com/news-new-microphone-solutions-for-ceiling-and-desk-installation, Feb. 2011, 2 pgs.
Sennheiser, TeamConnect Ceiling, https://en-us.sennheiser.com/conference-meeting-rooms-teamconnect-ceiling, 7 pgs.
Serdes, Wikipedia article, last edited on Jun. 25, 2018; retrieved on Jun. 27, 2018, 3 pp., https://en.wikipedia.org/wiki/SerDes.
Sessler, et al., "Directional Transducers," IEEE Transactions on Audio and Electroacoustics, vol. AU-19, No. 1, Mar. 1971, pp. 19-23.
Sessler, et al., "Toroidal Microphones," Journal of Acoustical Society of America, vol. 46, No. 1, 1969, 10 pp.
Shure AMS Update, vol. 1, No. 1, 1983, 2 pgs.
Shure AMS Update, vol. 1, No. 2, 1983, 2 pgs.
Shure AMS Update, vol. 4, No. 4, 1997, 8 pgs.
Shure Debuts Microflex Advance Ceiling and Table Array Microphones, Press Release, Feb. 9, 2016, 4 pp.
Shure Inc., A910-HCM Hard Ceiling Mount, retrieved from website <http://www.shure.com/en-US/products/accessories/a910hcm> on Jan. 16, 2020, 3 pp.
Shure Inc., Microflex Advance, http://www.shure.com/americas/microflex-advance, 12 pgs.
Shure Inc., MX395 Low Profile Boundary Microphones, 2007, 2 pgs.
Shure Inc., MXA910 Ceiling Array Microphone, http://www.shure.com/americas/products/microphones/microflex-advance/mxa910-ceiling-array-microphone, 7 pgs.
Shure, New MXA910 Variant Now Available, Press Release, Dec. 13, 2019, 5 pp.
Shure, Q&A in Response to Recent Us Court Ruling on Shure MXA910, Available at <https://www.shure.com/en-US/meta/legal/q-and-a-inresponse-to-recent-US-court-ruling-on-shure-mxa910-response>, As early as 2020, 5 pp.
Shure, RK244G Replacement Screen and Grille, Datasheet, 2013, 1 p.
Shure, The Microflex Advance MXA310 Table Array Microphone, Available at <https://www.shure.com/en-US/products/microphones/mxa310>, As early as 2020, 12 pp.
Signal Processor MRX7-D Product Specifications, Yamaha Corporation, 2016.
Silverman et al., Performance of Real-Time Source-Location Estimators for a Large-Aperture Microphone Array, IEEE Transactions on Speech and Audio Processing, vol. 13, No. 4, Jul. 2005, pp. 593-606.
Sinha, Ch. 9: Noise and Echo Cancellation, in Speech Processing in Embedded Systems, Springer, 2010, pp. 127-142.

(56) References Cited

OTHER PUBLICATIONS

SM 69 Stereo Microphone, Datasheet, Georg Neumann GmbH, Available at <https://ende.neumann.com/product_files/6552/download>, 1 p.

Soda et al., Introducing Multiple Microphone Arrays for Enhancing Smart Home Voice Control, The Institute of Electronics, Information and Communication Engineers, Technical Report of IEICE, Jan. 2013, 6 pgs.

Soundweb London Application Guides, BSS Audio, 2010.

Symetrix, Inc., SymNet Network Audio Solutions Brochure, 2008, 32 pgs.

SymNet Network Audio Solutions Brochure, Symetrix, Inc., 2008.

Tan, et al., "Pitch Detection Algorithm: Autocorrelation Method and AMDF," Department of Computer Engineering, Prince of Songkhla University, Jan. 2003, 6 pp.

Tandon, et al., "An Efficient, Low-Complexity, Normalized LMS Algorithm for Echo Cancellation," 2nd Annual IEEE Northeast Workshop on Circuits and Systems, Jun. 2004, pp. 161-164.

Tetelbaum et al., Design and Implementation of a Conference Phone Based on Microphone Array Technology, Proc. Global Signal Processing Conference and Expo (GSPx), Sep. 2004, 6 pgs.

Tiete et al., SoundCompass: A Distributed MEMS Microphone Array-Based Sensor for Sound Source Localization, Sensors, Jan. 23, 2014, pp. 1918-1949.

TOA Corp., Ceiling Mount Microphone AN-9001 Operating Instructions, http://www.toaelectronics.com/media/an9001_mt1e.pdf, 1 pg.

Togami, et al., "Subband Beamformer Combined with Time-Frequency ICA for Extraction of Target Source Under Reverberant Environments," 17th European Signal Processing Conference, Aug. 2009, 5 pp.

U.S. Appl. No. 16/598,918, filed Oct. 10, 2019, 50 pp.

Van Compernolle, Switching Adaptive Filters for Enhancing Noisy and Reverberant Speech from Microphone Array Recordings, Proc. IEEE Inf. Conf. on Acoustics, Speech, and Signal Processing, Apr. 1990, pp. 833-836.

Van Trees, Optimum Array Processing: Part IV of Detection, Estimation, and Modulation Theory, 2002, 54 pgs., pp. i-xxv, 90-95, 201-230.

Van Veen et al., Beamforming: A Versatile Approach to Spatial Filtering, IEEE ASSP Magazine, vol. 5, issue 2, Apr. 1988, pp. 4-24.

Vicente, "Adaptive Array Signal Processing Using the Concentric Ring Array and the Spherical Array," Ph.D. Dissertation, University of Missouri, May 2009, 226 pp.

Wang et al., Combining Superdirective Beamforming and Frequency-Domain Blind Source Separation for Highly Reverberant Signals, EURASIP Journal on Audio, Speech, and Music Processing, vol. 2010, pp. 1-13.

Warsitz, et al., "Blind Acoustic Beamforming Based on Generalized Eigenvalue Decomposition," IEEE Transactions on Audio, Speech and Language Processing, vol. 15, No. 5, 2007, 11 pp.

Weinstein, et al., "LOUD: A 1020-Node Microphone Array and Acoustic Beamformer," 14th International Congress on Sound & Vibration, Jul. 2007, 8 pgs.

Weinstein, et al., "LOUD: A 1020-Node Modular Microphone Array and Beamformer for Intelligent Computing Spaces," MIT Computer Science and Artifical Intelligence Laboratory, 2004, 18 pp.

Wung, "A System Approach to Multi-Channel Acoustic Echo Cancellation and Residual Echo Suppression for Robust Hands-Free Teleconferencing," Georgia Institute of Technology, May 2015, 167 pp.

XAP Audio Conferencing Brochure, ClearOne Communications, Inc., 2002.

Yamaha Corp., MRX7-D Signal Processor Product Specifications, 2016, 12 pgs.

Yamaha Corp., PJP-100H IP Audio Conference System Owner's Manual, Sep. 2006, 59 pgs.

Yamaha Corp., PJP-EC200 Conference Echo Canceller Brochure, Oct. 2009, 2 pgs.

Yan et al., Convex Optimization Based Time-Domain Broadband Beamforming with Sidelobe Control, Journal of the Acoustical Society of America, vol. 121, No. 1, Jan. 2007, pp. 46-49.

Yensen et al., Synthetic Stereo Acoustic Echo Cancellation Structure with Microphone Array Beamforming for VOIP Conferences, 2000 IEEE International Conference on Acoustics, Speech, and Signal Processing, Jun. 2000, pp. 817-820.

Yermeche, et al., "Real-Time DSP Implementation of a Subband Beamforming Algorithm for Dual Microphone Speech Enhancement," 2007 IEEE International Symposium on Circuits and Systems, 4 pp.

Zavarehei, et al., "Interpolation of Lost Speech Segments Using LP-HNM Model with Codebook Post-Processing," IEEE Transactions on Multimedia, vol. 10, No. 3, Apr. 2008, 10 pp.

Zhang, et al., "F-T-LSTM based Complex Network for Joint Acoustic Echo Cancellation and Speech Enhancement," Audio, Speech and Language Processing Group, Jun. 2021, 5 pp.

Zhang, et al., "Multichannel Acoustic Echo Cancelation in Multiparty Spatial Audio Conferencing with Constrained Kalman Filtering," 11th International Workshop on Acoustic Echo and Noise Control, Sep. 14, 2008, 4 pp.

Zhang, et al., "Selective Frequency Invariant Uniform Circular Broadband Beamformer," EURASIP Journal on Advances in Signal Processing, vol. 2010, pp. 1-11.

Zheng, et al., "Experimental Evaluation of a Nested Microphone Array With Adaptive Noise Cancellers," IEEE Transactions on Instrumentation and Measurement, vol. 53, No. 3, Jun. 2004, 10 pp.

\* cited by examiner

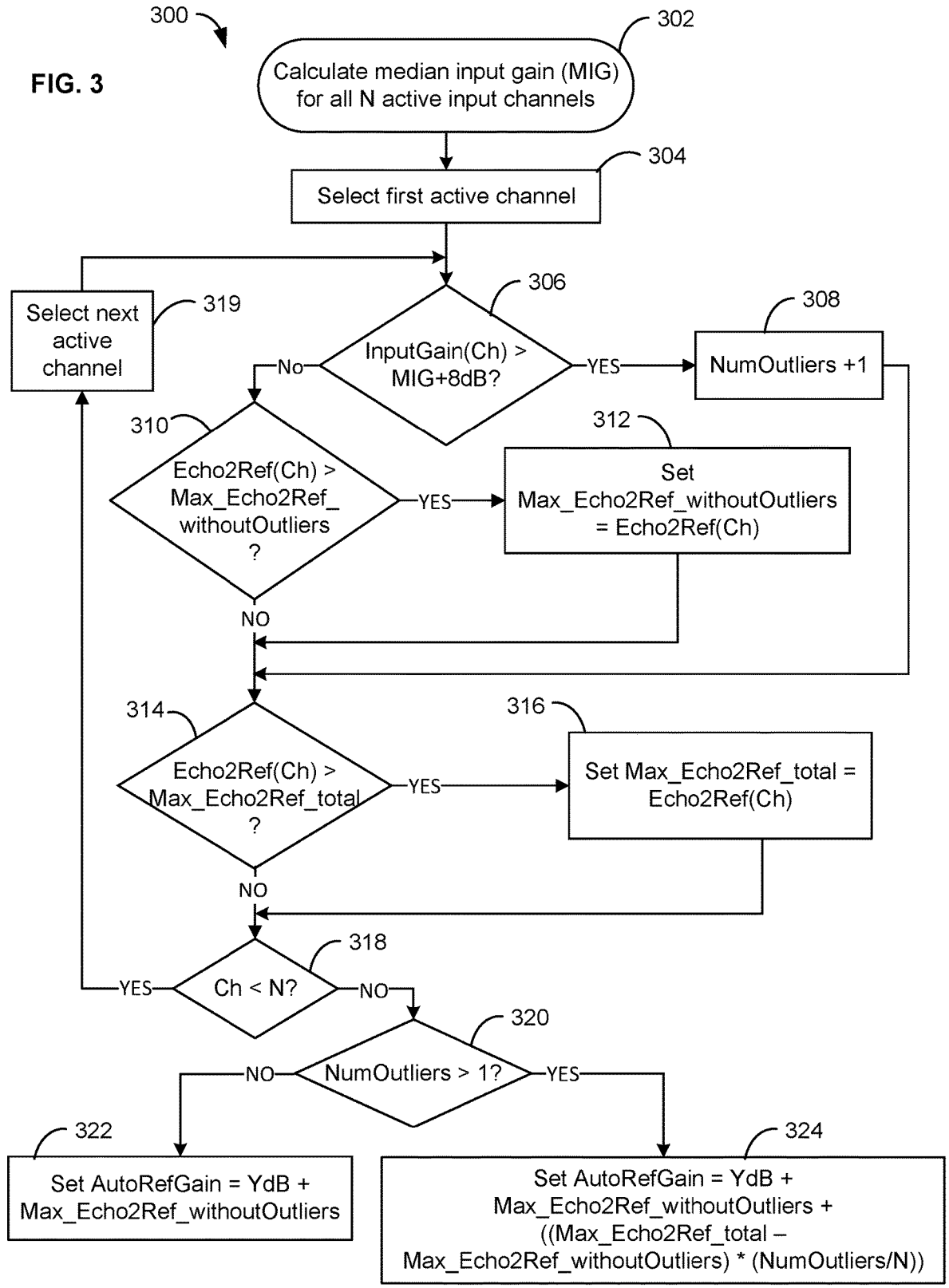

SYSTEM AND METHOD FOR AUTOMATIC ADJUSTMENT OF REFERENCE GAIN

CROSS-REFERENCE

This application claims the benefit of U.S. Provisional Patent Application No. 62/971,850, filed on Feb. 7, 2020, the contents of which is incorporated by reference herein in its entirety.

TECHNICAL FIELD

This disclosure generally relates to gain adjustment of a reference signal provided to a mixer for mixing audio signals from a plurality of acoustic sources, such as microphones used in a conferencing system. In particular, the disclosure relates to systems and methods for automatically adjusting the reference gain.

BACKGROUND

Conferencing environments, such as boardrooms, conferencing settings, and the like, can involve the use of microphones for capturing sound from audio sources (also known as the "near end") and loudspeakers for presenting audio from a remote location (also known as the "far end"). For example, persons in a conference room may be conducting a conference call with persons at a remote location. Typically, speech and sound from the conference room may be captured by microphones and transmitted to the remote location, while speech and sound from the remote location may be received and played on loudspeakers in the conference room. Multiple microphones may be used in order to optimally capture the speech and sound in the conference room.

In some cases, the microphones may pick up the speech and sound from the remote location that is played on the loudspeakers. In such situations, the audio transmitted to the remote location may include not only the speech and sound from the conference room, but also the speech and sound from the remote location, thus creating an undesirable echo for the persons at the remote location hearing their own speech and sound. If there is no correction, the audio transmitted to the remote location may therefore be low quality or unacceptable due to this echo.

Some existing communication systems utilize echo cancellation techniques to minimize, or cancel out, the echo in the mixed audio signal. For example, some systems utilize an acoustic echo canceller for each of the multiple microphones, and a mixer to subsequently mix and process each echo-cancelled microphone signal. However, these types of systems may be computationally intensive and complex. For example, separate and dedicated processing may be needed to perform acoustic echo cancellation on each microphone signal. Other systems place an acoustic echo canceller after the mixer. However, some such systems work poorly due to the need to constantly re-adapt to the mixed signal generated by the mixer, specifically where the mixer is dynamic and therefore, the gains on one or more of the mixer channels changes over time.

Accordingly, there is an opportunity for improved techniques that address these concerns.

SUMMARY

The invention is intended to solve the above-noted problems by providing systems and methods designed to automatically adjust a gain of a reference input channel that is fed into a mixer for generating a mixed audio signal based on near end audio signals, wherein the reference input channel provides a far end audio signal to the mixer for gate-inhibit purposes.

One example embodiment provides a system, comprising a plurality of microphone elements, each microphone element configured to detect sound and convert the sound to a near end audio signal; at least one audio output device configured to output a far end audio signal comprising sound captured at a remote location; an audio mixer having a plurality of audio input channels for receiving audio signals captured by the plurality of microphone elements and a reference channel for receiving the far end audio signal as a reference signal; and a reference gain adjuster configured to automatically determine a gain amount for the reference channel based on an echo level detected in an input audio signal received at a given audio input channel.

Another example embodiment provides a method of automatically adjusting a reference gain of an audio mixer having a reference channel for receiving a far end audio signal from a remote location as a reference signal and a plurality of audio input channels for receiving audio signals captured by a plurality of microphone elements, the method comprising determining an echo level in an input audio signal received at a given audio input channel; and automatically determining a gain amount for the reference channel based on the echo level.

These and other embodiments, and various permutations and aspects, will become apparent and be more fully understood from the following detailed description and accompanying drawings, which set forth illustrative embodiments that are indicative of the various ways in which the principles of the invention may be employed.

BRIEF DESCRIPTION OF THE DRAWINGS

FIG. 3 is a flowchart illustrating operations for performing automatic reference gain adjustment when one or more microphone inputs are boosted, using the communication system of FIG. 1, in accordance with some embodiments.

DETAILED DESCRIPTION

Figure 1:
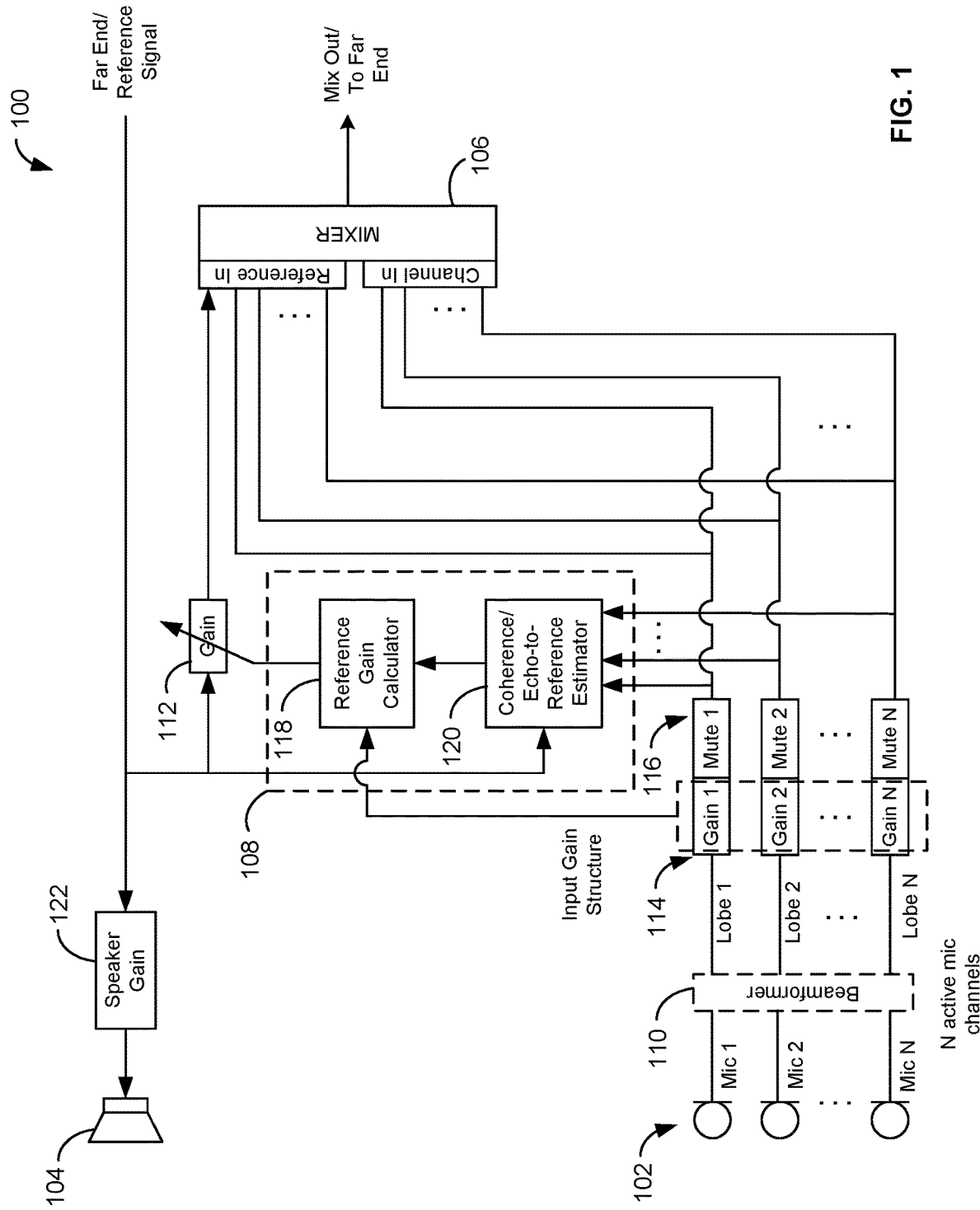
FIG. 1 is a schematic diagram of a communication system including an automatic reference gain adjustment module, in accordance with some embodiments.

The description that follows describes, illustrates, and exemplifies one or more particular embodiments of the invention in accordance with its principles. This description is not provided to limit the invention to the embodiments described herein, but rather to explain and teach the principles of the invention in such a way to enable one of ordinary skill in the art to understand these principles and, with that understanding, be able to apply them to practice not only the embodiments described herein, but also other embodiments that may come to mind in accordance with these principles. The scope of the invention is intended to cover all such embodiments that may fall within the scope of the appended claims, either literally or under the doctrine of equivalents.

It should be noted that in the description and drawings, like or substantially similar elements may be labeled with the same reference numerals. However, sometimes these elements may be labeled with differing numbers, such as, for example, in cases where such labeling facilitates a more clear description. Additionally, the drawings set forth herein are not necessarily drawn to scale and in some instances, proportions may have been exaggerated to more clearly depict certain features. Such labeling and drawing practices do not necessarily implicate an underlying substantive purpose. As stated above, the specification is intended to be taken as a whole and interpreted in accordance with the principles of the invention as taught herein and understood to one of ordinary skill in the art.

FIG. 1 is a schematic diagram of a communication system 100 comprising a plurality of microphones 102 for capturing sound from one or more audio sources in an environment (also referred to herein as "near end audio"), a loudspeaker 104 for presenting audio received from a remote location (also referred to herein as "far end audio"), and an audio mixer 106 for generating a mix of the near end audio for sending to the remote location. For example, environments such as conference rooms may utilize the communication system 100 to facilitate communication with persons situated at the remote location, which may be another room, building, city, or any other area that is separate from the given environment. The components of the communication system 100 may be in communication with each other using wired and/or wireless connections. In the latter case, the communication system 100 may further include a communications module for enabling wireless communication between various components of the communication system 100 itself, and/or to facilitate wireless communication with the remote location.

The types of microphones 102 and their placement in a particular environment may depend on the locations of the audio sources, physical space requirements, aesthetics, room layout, and/or other considerations. For example, in some environments, the microphones 102 may be placed on a table or lectern near the audio sources. In other environments, the microphones 102 may be mounted overhead to capture the sound from the entire room, for example. The communication system 100 may work in conjunction with any type and any number of microphones 102.

Various components included in the communication system 100 may be implemented using software executable by one or more servers or computers, such as a computing device with a processor and memory, by hardware (e.g., discrete logic circuits, application specific integrated circuits (ASIC), programmable gate arrays (PGA), field programmable gate arrays (FPGA), etc.), or using a combination software and hardware.

Figure 2:
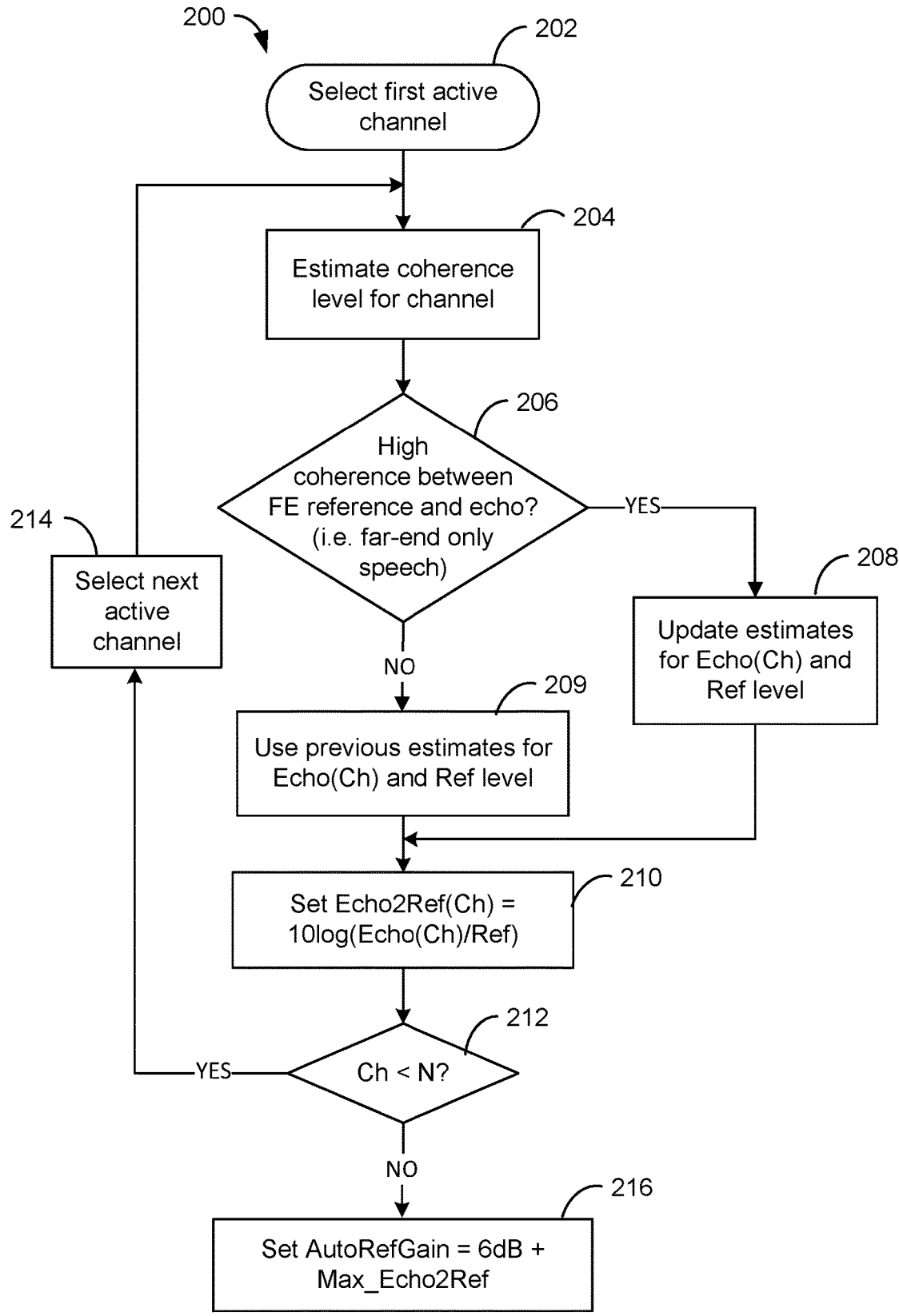
FIG. 2 is a flowchart illustrating operations for performing automatic reference gain adjustment using the communication system of FIG. 1, in accordance with some embodiments.

FIGS. 2 and 3 illustrate exemplary processes for utilizing the communication system 100, in accordance with embodiments. In particular, FIG. 2 illustrates a process 200 for automatically adjusting a gain of a reference input signal representing far end audio, using the communication system 100, and FIG. 3 illustrates a method 300 for performing automatic reference gain adjustment when one or more of microphone inputs are boosted, or have an extra gain structure, using the communication system 100. One or more processors and/or other processing components within the communication system 100 may perform any, some, or all of the steps of each of the processes 200 and 300. One or more other types of components (e.g., memory, input and/or output devices, transmitters, receivers, buffers, drivers, discrete components, etc.) may also be utilized in conjunction with the processors and/or other processing components to perform any, some, or all of the steps of each of the processes 200 and 300. In general, a computer program product in accordance with the embodiments includes a computer-usable storage medium (e.g., standard random access memory (RAM), an optical disc, a universal serial bus (USB) drive, or the like) having computer-readable program code embodied therein, wherein the computer-readable program code is adapted to be executed by a processor (e.g., working in connection with an operating system) to implement the processes described herein. In this regard, the program code may be implemented in any desired language, and may be implemented as machine code, assembly code, byte code, interpretable source code or the like (e.g., via C, C++, Java, Actionscript, Objective-C, Javascript, CSS, XML, and/or others).

Referring now to FIG. 1, the communication system 100 can include the microphones 102, loudspeaker 104, audio mixer 106, and an automatic reference gain adjustment module 108. Each of the microphones 102 (also referred to herein as a "microphone element") can be configured to detect sound in the environment and convert the sound to an audio signal. In embodiments, some or all of the audio signals (also referred to herein as "near end audio signals") from the microphones 102 may be processed by a beamformer 110 to generate one or more beamformed audio signals (or lobes), as is known in the art. In such cases, the beamformed audio signals may be provided to the audio mixer 106 as input audio signals, as shown in FIG. 1. While the following description may refer to audio signals from microphones 102 for the sake of simplicity, it is contemplated that the techniques described herein may be utilized with any type of acoustic source or signal, including the beamformed audio signals (or lobes) generated by beamformer 110. The beamformer 110 may be any suitable beamformer, such as, e.g., a delay and sum beamformer, etc.

As shown in FIG. 1, the audio mixer 106 receives audio signals, or audio input signals, from the microphones 102 and/or the beamformer 110 at respective audio input channels and generates a mixed audio signal using the received audio signals. The mixed audio signal generated by the mixer 106 may conform to a desired audio mix such that the audio signals from certain microphones 102 are emphasized and the audio signals from other microphones 102 are deemphasized or suppressed, as described herein. Exemplary embodiments of audio mixers are disclosed in commonly-assigned patents, U.S. Pat. Nos. 4,658,425 and 5,297,210, each of which is incorporated by reference in its entirety. In some embodiments, the mixed audio signal may be provided to an acoustic echo canceller (not shown) that is either included in, or coupled to, the communication system 100.

The loudspeaker 104 (also referred to herein as "audio output device") can be configured to output audio signals received from the remote location (e.g., via wired or wireless communication). The received audio signals (also referred to herein as "far end audio signals") may include speech and/or sound captured by microphones located at the remote location. Sometimes, one or more of the microphones 102 may pick up the far end audio as it is being played on the loudspeaker 104, in addition to the near end audio that is present in the environment. In such cases, if left unmitigated, the mixed audio signal may produce an undesirable echo due to persons at the remote location hearing their own speech and sound. One technique for minimizing this echo is to utilize a "gate-inhibit" technique that prevents the mixer 106 from outputting a mixed audio signal that includes the far end audio being played by the loudspeaker. This technique is achieved, at least in part, by providing the far end audio signal to a reference input channel of the mixer and adjusting a gain of the reference input channel so that the far end signal level is high enough to "win" against any "far end echoes" picked up by the microphones 102 and provided to the audio input channels of the mixer 106.

Existing reference gain adjustment systems require manual configuration by an installer while physically testing the environment for echo issues. Specifically, the installer manually boosts a gain of the reference input channel, for example, using a physical slider or other manual input device, until the gate inhibit feature of the mixer is activated. However, if the installer sets the gain too high, this may result in drowning out or suppressing the near end audio, particularly in double-talk situations, sluggish gating, and other undesirable effects. Thus, the effectiveness of existing systems depends greatly on the skill level of the installer or operator.

The communication system 100 shown in FIG. 1 includes an automatic reference gain adjustment module 108 configured to automatically adjust a gain amount applied to the reference input channel of the mixer 106 for receiving the far end audio signal transmitted by the remote location, based on one or more inputs from the communication system 100. According to embodiments, this gain amount (also referred to herein as "reference gain") can be controlled using a reference gain 112, or reference gain device, which may be implemented in hardware (e.g., an amplifier or the like), software, or a combination thereof. Thus, the communication system 100 can precisely control the far end reference gain so as to mitigate an echo in the mixed audio signal provided to the remote location.

As shown in FIG. 1, the mixer 106 may have a plurality of audio input channels (e.g., N channels) for receiving audio signals captured by a plurality of microphones 102 (e.g., N or more microphones), a corresponding plurality of reference input channels (e.g., N channels) for receiving the same audio signals (e.g., to help the mixer 106 avoid reverberation and other undesirable effects due to multiple microphones picking up the same audio source), and an additional reference input channel for receiving the audio signal received from the remote location (i.e. the far end reference input channel). Based on the N+1 reference input channels (or "reference channels"), the mixer 106 selects mixer-matrix gains for each of the N channel inputs (i.e. the near end audio signals), such that the channels considered "active" are gated-on (e.g., by applying a gain of 0 dB) and the remaining channels, i.e. those considered "inactive," or gated-off (e.g., by applying a low gain or attenuation, such as −20 dB). The input gains 114 are applied to all channel inputs, and the mixed output, or mixed audio signal, is obtained based on the selected combination of channel inputs and gains at the mixer 106. As described further below, when a far-end reference signal with sufficient gain is applied to the appropriate reference input channel of the mixer 106, the mixer 106 can gate-off select channel inputs, as needed, to prevent or minimize the presence of an echo in the mixed audio signal output by the mixer 106.

In the illustrated embodiment, each microphone 102 is coupled to, or corresponds to, a respective one of the audio input channels of the mixer 106. In other embodiments, the number of microphones 102 (i.e. "M" microphones) may exceed the number of audio input channels (i.e. M>N) and/or each audio input channel may be configured to receive a respective one of the plurality of beamformed audio signals (e.g., N signals) output by the beamformer 110, each beamformed audio signal including audio signals captured by multiple microphones 102.

As shown, each audio input channel has individually controllable gain and mute settings. The gain settings can be controlled using an input gain 114, or input gain device, that is coupled to each input channel of the mixer 106 and can be implemented using hardware (e.g., an amplifier or the like), software, or a combination thereof. Likewise, the mute settings can be controlled using a mute device 116 that is coupled to each input channel and can be implemented using hardware (e.g., a mute button or the like), software, or a combination thereof. In various embodiments, the gain devices 114 and/or the mute devices 116 may be included in the mixer 106, embedded in or coupled to the respective microphones 102, included in a separate component of the communication system 100, or a combination thereof.

The mute settings provide a mute status (e.g., muted or unmuted) of the audio input channel, or the microphone 102 coupled thereto, and based thereon, determine whether the corresponding audio input channel is active or inactive. Specifically, if a given microphone 102 is unmuted, the corresponding input channel will be deemed "active." If, on the other hand, a given audio input channel or microphone 102 is muted, the audio input channel will be deemed "inactive." In embodiments, muted or inactive input channels do not contribute to calculation of a median gain or "outliers" and thus, may not participate in the algorithm decision making described herein, for example, with respect to FIG. 3.

The input gain settings can be used to emphasize or de-emphasize certain active microphone(s) (e.g., the chairperson of a meeting) or audio input channels, while keeping the rest of the active microphones or channels at the same gain level. Since input gain levels affect the overall gain structure of the audio input channels, the input gain settings may be referred to as an input gain structure of the microphones 102. As shown in FIG. 1, the input gain structure is provided as an input to the automatic reference gain adjustment module 108 for calculating echo-to-reference estimates and the final reference gain 112, as described in further detail herein.

In embodiments, the input gain settings enable one or more active channels to be gated-on, or emphasized, more easily by the mixer 106. For example, if the input gain 114 for a first channel is increased or set to a higher level than that of the other channels, and audio at substantially similar sound levels are simultaneously received across multiple channels, including the first channel, the mixer 106 will perceive the first channel as having a higher gain level than the other channels and accordingly, will select, or gate-on, the first channel. As will be appreciated, decreasing the input gain 114 of a given channel can have the opposite effect, thus de-emphasizing the channel having a lower input gain level.

In some embodiments, the input gain for each microphone 102, or audio input channel, is a static setting that is either controlled manually by the installer or operator, or automatically set using an algorithm. For example, in a conference room situation, the input gain settings may be configured to emphasize the microphone 102 located at the head of the room or table. In other embodiments, the input gain is a flexible setting that can be adjusted for each meeting or event. For example, a select input gain 114 may be configured so that the microphone 102 being used by a specific speaker or participant is emphasized (or given preference), irrespective of their location in the room or table seat. In another example, each input gain 114 may be set to an equal gain level for one event, and a different combination of gain levels for another event. As will be appreciated, in the case of flexible input gain settings, the reference gain settings are adjusted accordingly.

As described herein, the mixer 106 can be configured to use a "gate-inhibit" technique, or algorithm, to prevent the audio input channels from "gating on," or being activated, when they pick up the audio being played by the loudspeaker 104 (i.e. an echo). This involves boosting a gain of the far end reference input channel so that, when the far end signal is playing on the loudspeaker 104, the far end reference channel is the only channel that is gating on, and the remaining audio input channels are "gate-inhibited," or prevented from gating on.

Typically, gating decisions are made by comparing an energy level (e.g., decibel level) of a given audio input channel to a current maximum energy level, e.g., the highest energy level of all input channels for a preset duration of time (e.g., 400 milliseconds), to determine whether the corresponding microphone 102 is picking up audio from an audio source, as will be appreciated. If the energy level is sufficiently high enough (e.g., equal to 90% or more of the maximum level), the audio input channel becomes active and, for example, a lobe is pointed towards the audio source (e.g., talker). To prevent the microphones 102 from gating on in response to picking up the loudspeaker audio, the audio input channels are additionally compared to the far end reference channel during a gating decision. If the signal level of a given audio input channel does not exceed a signal level of the far end reference channel, i.e. due to the audio input channel picking up the loudspeaker audio instead of the audio sources in the environment, the far end reference channel will "win" the gating decision, and the audio input channel will not be activated. However, since the far end reference channel is not actually a physical output channel, no outputs are provided to the mixer 106 for generating the mixed audio signal. In this manner, the far end audio can be prevented from causing audio input channels connected to the mixer 106 from gating on and creating an echo in the mixed audio signal.

The automatic reference gain adjustment module 108 (also referred to herein as a "reference gain adjuster") can improve the functionality of this gate inhibit technique by automatically selecting an appropriate gain amount for the reference gain device 112 coupled to the far end reference input channel (or far end reference channel) based on an echo signal detected at one or more audio input channels (or audio channels), so that the far end audio signal "wins" the gating decision each time the microphones 102 pick up the audio playing on the loudspeaker 104 (i.e. an echo). In this manner, the reference gain amount can be configured to remove the echo signal from, or reduce a contribution of the echo signal to, the input audio signals before the audio mixer 106 generates the mixed audio signal for sending to the remote location. To achieve this, the reference gain adjuster 108 utilizes a reference gain calculator 118 and a coherence estimator 120 (also referred to herein as an "echo-to-reference estimator"), which may be included in the adjustment module 108, as shown in FIG. 1. In various embodiments, the reference gain adjuster 108 may be included in the mixer 106, provided as a separate component of the communication system 100, or a combination thereof. In some embodiments, the coherence estimator 120 may be part of an acoustic echo canceller (AEC) coupled to or included in the system 100, or may be configured to receive coherence information from the AEC.

According to embodiments, the reference gain calculator 118 is configured to calculate or determine an appropriate value or level for the reference gain 112 based on an echo-to-reference ratio received from the coherence estimator 120 and, in at least some cases, the input gain structure received from the input gain devices 114 (e.g., as described with reference to FIG. 3). The coherence estimator 120 is configured to determine the echo-to-reference ratio based on an echo level detected in the audio signal received at a given audio input channel. More specifically, the coherence estimator 120 may be configured to compare the reference signal to the near end audio signal to detect the presence of an echo, or echo signal, and determine a level of coherence based on the echo signal and the reference signal, and if there is high coherence, determine the echo-to-reference ratio for the given audio input channel by estimating an energy level of the echo signal (or "echo level") and an energy level of the reference signal (or "reference level").

The reference gain adjuster 108 is further configured to determine which active audio input channel has the highest (or worst) echo-to-reference ratio and use that highest ratio to determine the gain amount applied by the reference gain 112 to the far end reference input channel. More specifically, the reference gain calculator 118 is configured to automatically adjust or set the reference gain amount to a preset value that is a predetermined number of decibels (dB) higher than the highest echo-to-reference ratio. For example, in at least one embodiment, the reference gain calculator 118 calculates the reference gain amount by adding 6 dB to the highest echo-to-reference ratio determined for the active audio input channels. In this manner, the calculated reference gain will be high enough to "defeat" any echo signals present in the audio input channels of the mixer 106, but not so high that it would prevent the audio input channels from gating on when there is speech at the near end (e.g., a double-talk situation).

Referring now to FIG. 2, the above-described technique for automatically adjusting reference gain may be implemented using exemplary method or process 200, in accordance with embodiments. For example, process 200 may be performed by one or more components of the communication system 100, including the reference gain adjuster 108. Accordingly, process 200 will be described below with reference to the communication system 100 of FIG. 1.

As shown, the process 200 may begin at block 202 by selecting a first one of the N active audio input channels. As described herein, each audio input channel may have a mute setting that determines whether the channel is identified as "active" or "inactive" (e.g., an unmuted or muted status of the mute device 116, respectively). In embodiments, the reference gain adjuster 108 is configured to calculate echo-to-reference ratios for all active audio input channels, or otherwise analyze only the active audio channels for echo signals. Accordingly, block 202 may also include determining whether a given audio channel is active or inactive based on a mute setting associated with that channel.

At block 204, the coherence estimator 120 estimates or calculates a coherence level for the given active audio input channel, or how much of the audio signal received at the input channel is due to the far end audio signal (i.e. corresponds to echo) versus the near end audio signal. For example, the coherence estimator 120 may determine the coherence level by comparing the reference signal to the input audio signal using cross-correlation techniques or other suitable coherence computation involving the signal envelope and/or Fourier Transform of each signal. The coherence level may be a cross-correlation coefficient or other suitable metric obtained using said techniques.

Once the coherence level is estimated for the first channel, the process 200 continues to block 206 where the coherence estimator 120 determines whether there is high coherence between the input audio signal and the reference signal. For example, high coherence may be found if the coherence level calculated at step 204 is greater than a preset threshold (e.g., 80%). In embodiments, a high level of coherence can indicate that only the far-end audio is present in the audio signal received at the given input channel, i.e. the input audio signal only or mostly contains a far end echo (or echo signal) and/or no near end audio is present in the environment (e.g., because the near end talkers are presumably silent). A low level of coherence can indicate that the input audio signal is most likely due to near-end talkers (i.e. no or very little far-end echo is present in the environment). A medium level of coherence can indicate the presence of "double-talk" in the input audio signal (i.e. both near end audio and far end audio are present in the environment).

If there is high coherence between the two signals at block 206 (i.e. the input audio signal primarily contains a far-end echo), the input audio signal is treated as the "echo signal," and the process 200 continues to block 208, where the coherence estimator 120 calculates a new estimate for the echo level ("Echo(Ch)") based on an energy level of the input audio signal (which is the sum of the far-end echo and near-end speech, if any) and a new estimate for the reference level ("Ref") based on an energy level of the reference signal (i.e. the far end audio). If, on the other hand, high coherence is not found at block 206 (i.e. the coherence level is determined to be medium or low), the process 200 continues to block 209, where the coherence estimator 120 uses or retrieves previous estimates for the echo level and reference level. That is, at block 208, the Echo(Ch) and Ref levels are updated based on current estimates, while at block 209, the Echo(Ch) and Ref levels remain at previously calculated values, i.e. are not adjusted or re-calculated.

In embodiments, the process 200 may be an iterative process that improves over time as the estimates calculated at block 208, and therefore, the final auto reference gain amount, becomes more accurate. In such cases, when the process 200 is initialized or executed for the first time, a set of initial values may be assigned to each of the echo level and the reference level (e.g., −60 dB or other small positive value) and the determination at block 206 may necessarily be "no" (i.e. no high coherence). The initial values may be replaced with newly estimated values for the echo and reference levels after the coherence estimator 120 first identifies the existence of high coherence at block 206. The estimated values may be stored in a memory of the system 100 and continuously updated at block 208 each time high coherence is found at block 206. When high coherence is not found, the last set of estimates may be used at block 209 as the echo level and reference level for the current auto reference gain calculation. In this manner, the reference gain amount can remain high enough to offset future echo situations, even if a current situation does not contain an echo.

In embodiments, the echo level and reference level estimates may be calculated using respective exponentially weighted first order moving average equations, namely:

$$\text{Echo(Ch)}=A*\text{Echo(Ch)}+(1-A)*\text{AVG\_ECHO\_ENERGY}$$

$$\text{Ref}=A*\text{Ref}+(1-A)*\text{AVG\_REF\_ENERGY}$$

In the above equations, the parameter "A" is a smoothing factor, such as, for example, a discrete-time equivalent of a time constant (for a low-pass first order filter). This parameter, along with the first order moving average equations, may be used to smooth out the energy estimates over time and prevent sudden and/or random jumps in the estimates. In other embodiments, other suitable equations or energy estimators may be used to smooth out the energy estimates, such as, for example, a different smoothing method or a higher-order low pass filter.

From either block 208 or 209, the process 200 continues to block 210. At block 210, an echo-to-reference level, or ratio, for the given channel ("Echo2Ref(Ch)") is calculated converting a ratio of echo level to reference level (Echo (Ch)/Ref) to decibel (dB) units using the equation: 10*log (Echo(Ch)/Ref). As should be appreciated, the exact values used for "Echo(Ch)" and "Ref" at block 210 will vary depending on whether or not these values were updated at block 208.

At block 212, the coherence estimator 120 determines whether there are more channels to analyze. If there are (i.e. Ch<N), the next channel is selected at block 214 and blocks 204 through 210 are repeated for that channel. This continues until an echo-to-reference ratio has been calculated for each remaining active audio channel, or all N active channels have been analyzed (i.e. Ch=N).

Once all active channels have been analyzed, the process 200 further includes, either at block 216 or just prior to block 216, comparing the echo-to-reference ratios calculated for the N active channels using the coherence estimator 120 to determine which audio input channel has the highest echo-to-reference ratio ("Max_Echo2Ref"). In some embodiments, the coherence estimator 120 provides the echo-to-reference ratio estimated for each audio channel to the reference gain calculator 118, and the reference gain calculator 118 determines which of the received ratios is the highest. In other embodiments, the coherence estimator 120 determines which echo-to-reference ratio is the highest and provides only the highest ratio to the reference gain calculator 118.

At block 216, the reference gain calculator 118 calculates a reference gain amount using the highest echo-to-reference ratio. In particular, the reference gain calculator 118 sets or adjusts the reference gain to a preset value (e.g., 6 dB) above the highest echo-to-reference ratio (i.e. AutoRefGain=6 dB+Max_Echo2Ref). The reference gain calculator 118 then uses the final reference gain amount to adjust the gain 112 applied to the far end reference channel.

In process 200, it is assumed that all input gains 114 are set to the same value or level and therefore, it is sufficient to use the worst case scenario, i.e. the highest echo-to-reference ratio among all active audio channels, to determine the reference gain amount. However, in cases where there is an extra gain structure, or boost, for certain input channels (referred to herein as "outliers"), the appropriate reference gain for the far end reference input channel must be adjusted to "defeat" the outliers. In such cases, process 300 shown in FIG. 3 may be used to calculate the reference gain amount.

Referring now to FIG. 3, process 300 is configured for performing automatic reference gain adjustment when one or more of the microphone input gains (e.g., input gains 114 in FIG. 1) are boosted, or has a specific input gain setting that affects the echo-to-reference level estimate for that channel. The process 300 may be performed by one or more components of the communication system 100, such as the reference gain adjuster 108 shown in FIG. 1, in accordance with embodiments. The input gain "outliers" may exist because, for example, the installer manually boosted the input gain 114 of one or more audio input channels (e.g., to boost the microphone 102 located at the head of the room, etc.).

In various embodiments, the process 300 may begin after completing block 216 of the process 200 shown in FIG. 2. Namely, once the echo-to-reference ratios are calculated for all N active channels, and a maximum echo-to-reference ratio is determined and provided to the reference gain calculator 118, the process 300 may begin at block 302 with the reference gain calculator 118 receiving an input gain structure of the audio input channels from the input gains 114 shown in FIG. 1, and calculating a median input gain ("MIG") for all N active input channels based on these input gain amounts.

At block 304, the reference gain calculator 118 selects a first active audio input channel. At block 306, the reference gain calculator 118 scans or analyzes the selected channel in order to determine whether the channel is an outlier, or a channel whose input gain 114 is set to a level that is higher than the sum of MIG and XdB (where X is typically 8). If the determination at block 306 is "yes," a counter for the number of outliers (NumOutliers) is incremented by 1 at block 308, and the process 300 goes directly to block 314. If the determination at block 306 is "no," the process 300 continues to block 310.

At block 310, the reference gain calculator 118 determines whether the echo-to-reference level for the given channel ("Echo2Ref(Ch)") is greater than a maximum echo-to-reference level estimate over all channels but excluding outlier channels (denoted as "Max_Echo2Ref_withoutOutliers"). If the answer is "yes," the process 300 continues to block 312, where the Max_Echo2Ref_withoutOutliers estimate is set equal to the echo-to-reference level for the given channel. From block 312, the process 300 continues to block 314. If the answer at block 310 is "no," the process 300 goes directly to block 314.

At block 314, the reference gain calculator 118 determines whether the echo-to-reference level for the given channel ("Echo2Ref(Ch)") is greater than a maximum echo-to-reference estimate over all channels, including outlier channels (denoted as "Max_Echo2Ref total"). If the answer is "yes," the process 300 continues to block 316, where the Max_Echo2Ref total estimate is set equal to the echo-to-reference level for the given channel. From block 316, the process 300 continues to block 318. If the answer at block 314 is "no," the process 300 goes directly to block 318. In embodiments, the initial values for Max_Echo2Ref_withoutOutliers and Max_Echo2Ref total may be set to $-\infty$ dB.

At block 318, the reference gain calculator 118 determines whether there are any other active audio input channels (i.e. CH<N). If there are, process 300 continues to block 319, where the next active channel is selected and blocks 306 through 316 are repeated for that channel. This loop may continue until there are no more active channels remaining (i.e. CH=N or the determination at block 318 is "no"), at which point the process 300 continues to block 320.

At block 320, if there is only one input channel with a very high input gain (i.e. NumOutliers=1, or only one outlier channel), the process 300 continues to block 322, where the reference gain ("AutoRefGain") is automatically set to YdB higher than the Max_Echo2Ref_withoutOutliers estimate (where Y is typically 6), thus basically ignoring the outlier channel. This may be preferred in embodiments so as to not allow the outlier channel with the high input gain to set the reference gain to a value that is too high, as that would make it very difficult for near-end talkers to "break in," or for the near end audio to be picked up by the mixer 106.

If there is more than one outlier channel at block 320 (i.e. NumOutliers>1), the process 300 continues to block 324, where the reference gain ("AutoRefGain") is calculated using the following equation:

AutoRefGain=YdB+
Max_Echo2Ref_withoutOutliers+((NumOutliers/ N))*(Max_Echo2Ref total−
Max_Echo2Ref_withoutOutliers)), where Y is typically 6. In other words, the reference gain is linearly increased based on the number of outliers when there is more than one outlier. This allows the channels with high input gains to at least somewhat raise the amount of reference gain that is automatically applied.

The process 300 may end once the reference gain amount calculated at blocks 322 or 324 is applied to the reference gain 112 of the reference input channel. In this manner, the echo signal can be removed from the near end audio signals before a mixed audio signal is generated by the audio mixer 106 based on the near end audio signals.

Referring back to FIG. 1, the communication system 100 may also include a speaker gain 122 for controlling a gain level of the loudspeaker 104. The speaker gain 122 may affect the overall gain structure of the input channels and the "Echo2Ref" ratios estimated in method 200, as well as the final value of the reference gain calculated by either of the methods 200 and 300. According to embodiments, the speaker gain 122, or speaker gain device, may be implemented in hardware (e.g., an amplifier or the like), software, or a combination thereof.

Thus, systems and methods are provided herein that can mitigate an echo in a mixed audio signal provided to a remote location, wherein the mixed audio signal is generated by a mixer using audio signals captured by microphones in an environment that further includes a loudspeaker for playing a far end audio signal received from the remote location. The microphones can be prevented from contributing far end audio to the mixed audio signal by automatically adjusting a gain applied to a far end reference input channel that is used by the mixer to determine whether the audio channels should be activated due to detection of near end audio.

While embodiments shown and described herein include multiple audio input channels, other embodiments may include a communication system with a single audio input channel. Also, though a particular audio communication system is shown and described herein, other embodiments may include any type of system with multiple, or single, input channels and a reference input channel for controlling gating decisions based on a contribution of the reference signal in the environment. For example, the techniques described herein may be used in other situations where setting the reference gain automatically to an appropriate level can help determine the activity/contribution of the reference signal in the near-end signal (mix), and can allow the mixer decisions to be used to temporarily inhibit, disable, enable, or otherwise control other types of actions or mechanisms, such as, for example, voice, noise, and/or disturbance activity detectors in the near end, which attempt to determine if near end sounds in the room represent talkers or noise but should not do so if the near-end source of sound is associated with an echo; automatic focus of existing lobes, which attempts to better focus a beam to the exact position of the near-end talker in the room, but should not do so if the near-end source of sound is associated with an echo; and/or automatic placement of various lobes, which attempts to initially place a beam or lobe towards the position of the near-end talker in the room, but should not do so if that near-end source of sound is associated with an echo. Examples of such other systems are disclosed in commonly-assigned patent application U.S. Ser. No. 16/887,790 and U.S. Ser. No. 16/826,115, each of which is incorporated by reference in its entirety.

Any process descriptions or blocks in the figures, such as, e.g., FIGS. 2 and 3, should be understood as representing modules, segments, or portions of code which include one or more executable instructions for implementing specific logical functions or steps in the process, and alternate implementations are included within the scope of the embodiments of the invention in which functions may be executed out of order from that shown or discussed, including substantially concurrently or in reverse order, depending on the functionality involved, as would be understood by those having ordinary skill in the art.

This disclosure is intended to explain how to fashion and use various embodiments in accordance with the technology rather than to limit the true, intended, and fair scope and spirit thereof. The foregoing description is not intended to be exhaustive or to be limited to the precise forms disclosed. Modifications or variations are possible in light of the above teachings. The embodiment(s) were chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the embodiments as determined by the appended claims, as may be amended during the pendency of this application for patent, and all equivalents thereof, when interpreted in accordance with the breadth to which they are fairly, legally and equitably entitled.

What is claimed is:

1. A system, comprising:
   a plurality of microphone elements, each microphone element configured to detect sound and convert the sound to a near end audio signal;
   at least one audio output device configured to output a far end audio signal comprising sound captured at a remote location;
   an audio mixer having a plurality of audio input channels for receiving audio signals captured by the plurality of microphone elements and a reference channel for receiving the far end audio signal as a reference signal; and
   a reference gain adjuster configured to automatically determine a reference gain amount for the reference channel based on an echo level detected in an input audio signal received at a given audio input channel,
   wherein the reference gain adjuster determines the reference gain amount based on an echo-to-reference ratio calculated using the echo level and a reference level calculated for the reference signal.

2. The system of claim 1, wherein the reference gain adjuster is further configured to determine a coherence level based on the input audio signal and the reference signal, and if high coherence is found, calculating the echo-to-reference ratio based on the echo level.

3. The system of claim 1, wherein the reference gain adjuster is further configured to:
   calculate an echo-to-reference ratio for each remaining audio input channel,
   determine which audio input channel has a highest echo-to-reference ratio, and
   calculate the reference gain amount using the highest echo-to-reference ratio.

4. The system of claim 3, wherein the reference gain adjuster further determines the reference gain amount by adding a preset value to the highest echo-to-reference ratio.

5. The system of claim 3, wherein each audio input channel has a mute setting that determines if the channel is active or inactive, and the reference gain adjuster is configured to calculate echo-to-reference ratios for all active audio input channels.

6. The system of claim 1, wherein the reference gain adjuster is configured to determine the reference gain amount based further on an input gain structure of the audio input channels.

7. The system of claim 6, wherein each audio input channel has an individually-controllable input gain setting that is included in the input gain structure of the audio input channels.

8. The system of claim 6, wherein the reference gain adjuster is further configured to:
   calculate an average input gain based on the input gain structure of the audio input channels;
   identify a number of the audio input channels as having an input gain setting that is higher than the average input gain; and
   adjust the reference gain amount based on the echo-to-reference ratios calculated for the number of audio input channels.

9. The system of claim 1, wherein the audio mixer is configured to generate a mixed audio signal based on the audio signals captured by the microphones for sending to the remote location.

10. The system of claim 1, wherein the audio mixer is configured to apply the reference gain amount to the reference channel and make gating decisions for the plurality of audio input channels based on the reference channel.

11. A method of automatically adjusting a reference gain of an audio mixer having a reference channel for receiving a far end audio signal from a remote location as a reference signal and a plurality of audio input channels for receiving audio signals captured by a plurality of microphone elements, the method comprising:
   determining an echo level in an input audio signal received at a given audio input channel; and
   automatically determining a reference gain amount for the reference channel based on the echo level by:
      calculating an echo-to-reference ratio for the given audio input channel using the echo level and a reference level calculated for the reference signal, and
      calculating the reference gain amount based on the echo-to-reference ratio.

12. The method of claim 11, further comprising:
   determining a coherence level based on the input audio signal and the reference signal; and
   if high coherence is found, calculating the echo-to-reference ratio based on the echo level.

13. The method of claim 11, further comprising:
   calculating an echo-to-reference ratio for each remaining audio input channel,
   determining which audio input channel has a highest echo-to-reference ratio, and
   calculating the reference gain amount using the highest echo-to-reference ratio.

14. The method of claim 13, wherein calculating the reference gain amount further comprises adding a preset value to the highest echo-to-reference ratio.

15. The method of claim 13, further comprising:
determining whether each audio input channel is active or inactive based on a mute setting associated with that channel, and
analyzing all active audio input channels for echo signals.

16. The method of claim 11, further comprising: determining the reference gain amount based further on an input gain structure of the audio input channels.

17. The method of claim 16, wherein each audio input channel has an individually-controllable input gain setting that is included in the input gain structure of the audio input channels.

18. The method of claim 16, further comprising:
calculating an average input gain based on the input gain structure of the audio input channels;
identifying a number of the audio input channels as having an input gain setting that is higher than the average input gain; and
adjusting the reference gain amount based on the echo-to-reference ratios calculated for the number of audio input channels.

19. The method of claim 11, further comprising: generating a mixed audio signal based on said audio signals.

20. The method of claim 11, further comprising:
applying the reference gain amount to the reference channel; and
making gating decisions for the plurality of audio input channels based on the reference channel.

* * * * *

UNITED STATES PATENT AND TRADEMARK OFFICE
CERTIFICATE OF CORRECTION

| | | |
|---|---|---|
| PATENT NO. | : 11,552,611 B2 | Page 1 of 1 |
| APPLICATION NO. | : 17/169262 | |
| DATED | : January 10, 2023 | |
| INVENTOR(S) | : Dusan Veselinovic et al. | |

It is certified that error appears in the above-identified patent and that said Letters Patent is hereby corrected as shown below:

In the Specification

Column 11, Line 42, "Max_Echo2Ref total" should be changed to --Max_Echo2Ref_total--.

Column 11, Line 44, "Max_Echo2Ref total" should be changed to --Max_Echo2Ref_total--.

Column 11, Line 49, "Max_Echo2Ref total" should be changed to --Max_Echo2Ref_total--.

Column 12, Line 9, "Max_Echo2Ref total" should be changed to --Max_Echo2Ref_total--.

Signed and Sealed this
Nineteenth Day of September, 2023

Katherine Kelly Vidal
*Director of the United States Patent and Trademark Office*